US011967383B2

(12) United States Patent
Zhang et al.

(10) Patent No.: US 11,967,383 B2
(45) Date of Patent: Apr. 23, 2024

(54) NON-VOLATILE MEMORY WITH ENHANCED PROGRAM OPERATION FOR LAST STATE ON SLOW PLANE

(71) Applicant: WESTERN DIGITAL TECHNOLOGIES, INC., San Jose, CA (US)

(72) Inventors: Ke Zhang, Shanghai (CN); Ming Wang, Shanghai (CN); Liang Li, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 164 days.

(21) Appl. No.: 17/580,293

(22) Filed: Jan. 20, 2022

(65) Prior Publication Data

US 2023/0230638 A1 Jul. 20, 2023

(51) Int. Cl.
*G11C 16/04* (2006.01)
*G11C 16/10* (2006.01)
*G11C 16/32* (2006.01)

(52) U.S. Cl.
CPC ........ *G11C 16/102* (2013.01); *G11C 16/0483* (2013.01); *G11C 16/32* (2013.01)

(58) Field of Classification Search
CPC ... G11C 16/102; G11C 16/0483; G11C 16/32; G11C 5/025; G11C 11/5628; G11C 16/08; G11C 16/10; G11C 16/24; G11C 16/3459
USPC .................................................. 365/185.09
See application file for complete search history.

(56) References Cited

U.S. PATENT DOCUMENTS

| | | | |
|---|---|---|---|
| 7,054,193 B1 | 5/2006 | Wong | |
| 7,366,022 B2 | 4/2008 | Li | |
| 7,630,249 B2 | 12/2009 | Fong | |
| 7,978,520 B2 | 7/2011 | Mokhlesi | |
| 8,045,375 B2 | 10/2011 | Hemink | |
| 8,045,384 B2 | 10/2011 | Dong | |
| 8,254,177 B2 | 8/2012 | Hemink | |
| 9,142,298 B2 | 9/2015 | Dong | |
| 9,324,419 B2 | 4/2016 | Pang | |
| 9,437,318 B2 | 8/2016 | Dong | |
| 9,564,226 B1 | 2/2017 | Dunga | |
| 10,014,063 B2 * | 7/2018 | Tseng | G11C 16/10 |
| 10,134,474 B1 * | 11/2018 | Chen | G11C 16/26 |
| 10,381,095 B1 | 8/2019 | Date | |
| 10,755,788 B2 | 8/2020 | Rabkin | |
| 2007/0297247 A1 | 12/2007 | Hemink | |
| 2010/0058003 A1 | 3/2010 | Goto et al. | |
| 2013/0166825 A1 | 6/2013 | Kim et al. | |
| 2016/0141024 A1 | 5/2016 | Lee | |
| 2021/0304830 A1 | 9/2021 | Li | |
| 2021/0389879 A1 | 12/2021 | Inbar et al. | |

FOREIGN PATENT DOCUMENTS

KR  1020210109593 A  9/2021
WO  1996041346  12/1996

OTHER PUBLICATIONS

PCT International Search Report and Written Opinion dated Oct. 6, 2022, PCT Patent Application No. PCT/US2022/030055.

* cited by examiner

*Primary Examiner* — Tha-O H Bui
(74) *Attorney, Agent, or Firm* — Vierra Magen Marcus LLP

(57) ABSTRACT

To increase the speed of programming of a multi-plane non-volatile memory, it is proposed to accelerate the programming of the last one or more data states for one or more slow planes.

20 Claims, 26 Drawing Sheets

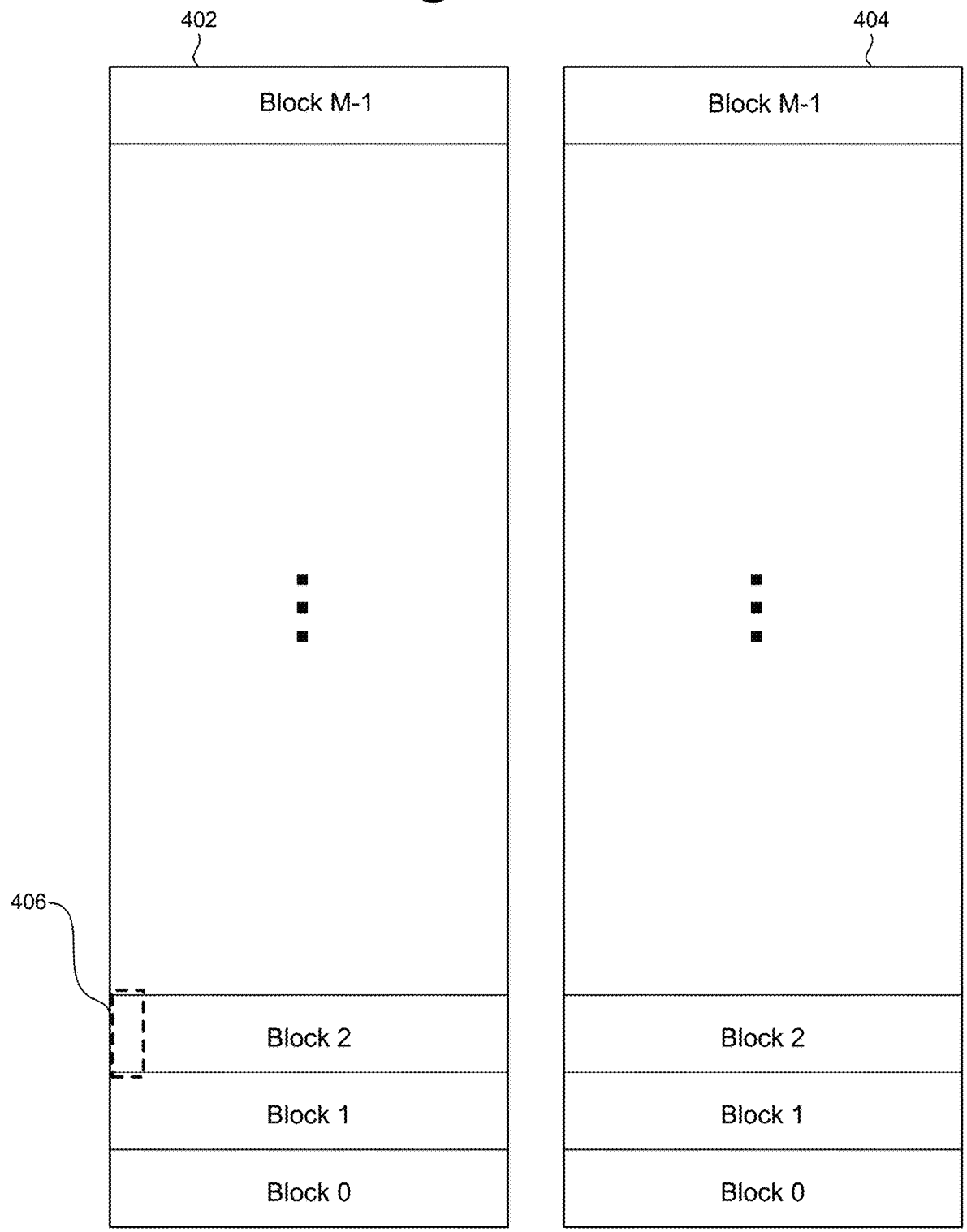

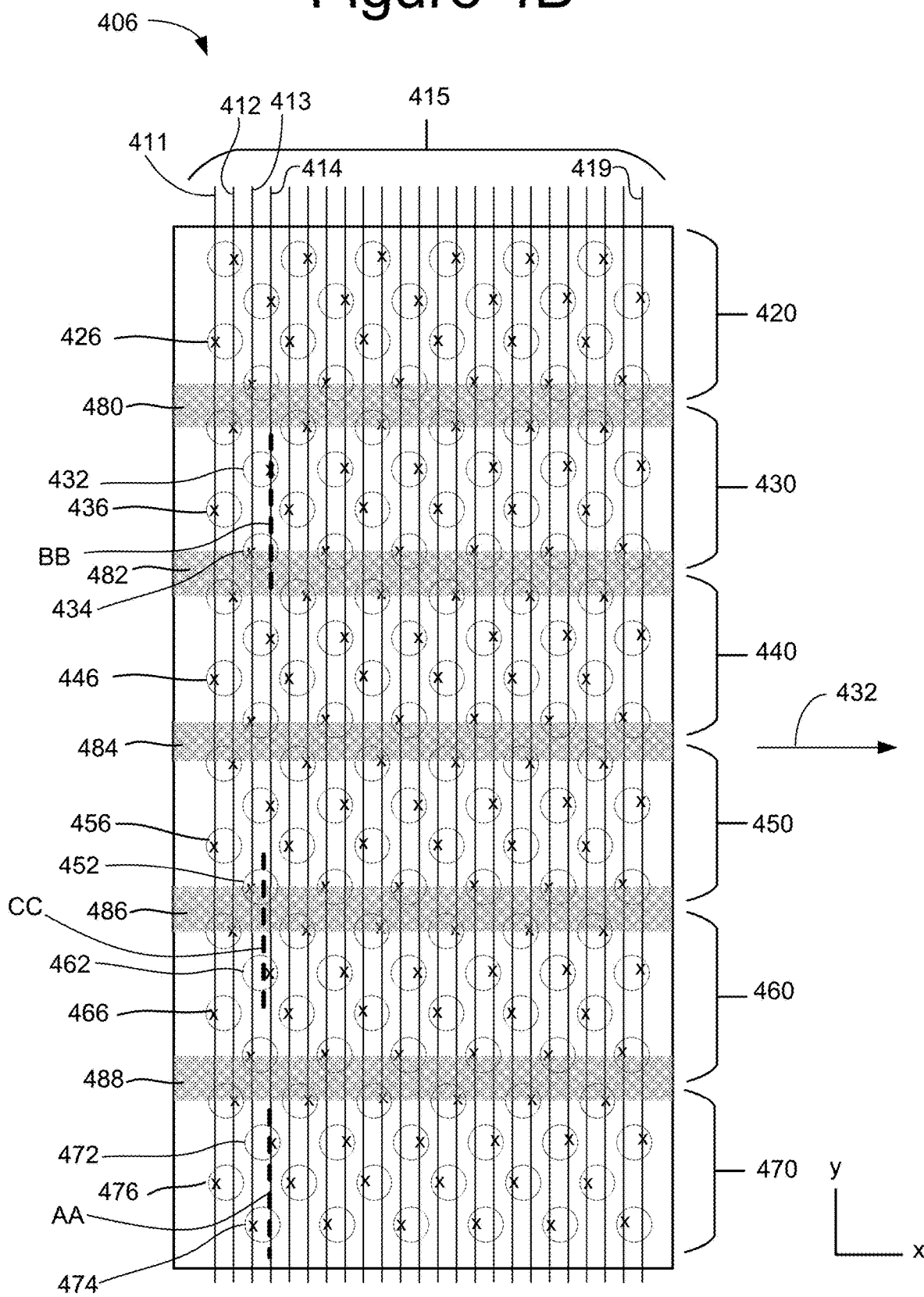

Figure 4C
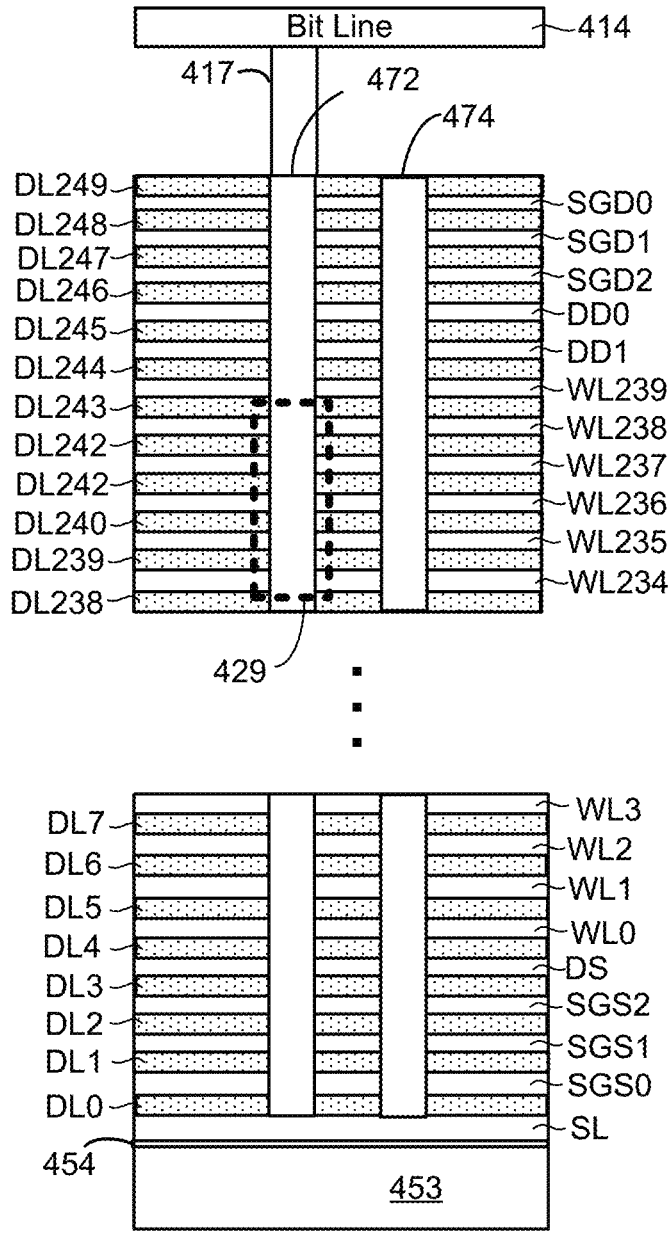
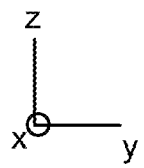

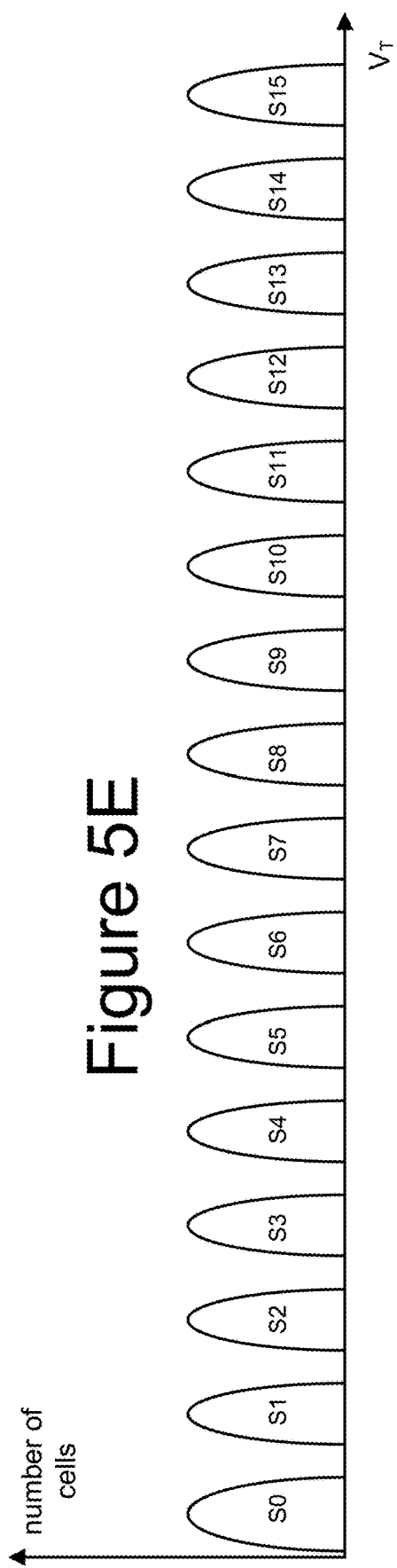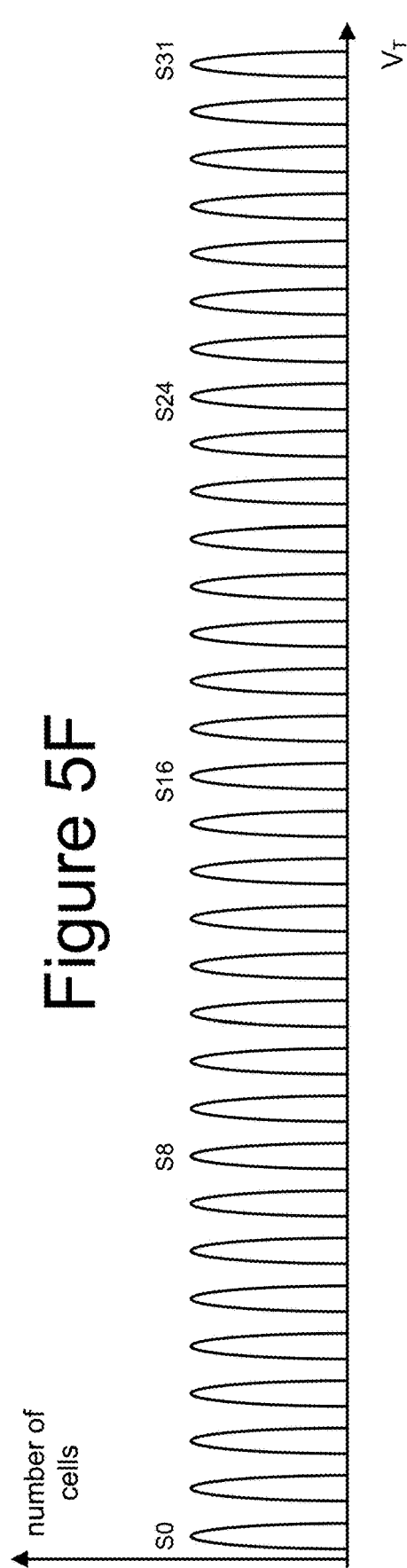

NON-VOLATILE MEMORY WITH ENHANCED PROGRAM OPERATION FOR LAST STATE ON SLOW PLANE

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can store data in the non-volatile memory and later read that data back. For example, a digital camera may take a photograph and store the photograph in non-volatile memory. Later, a user of the digital camera may view the photograph by having the digital camera read the photograph from the non-volatile memory. When storing data to non-volatile memory, performance is important as users typically do not like to wait for the memory to finish the programming/writing operation.

BRIEF DESCRIPTION OF THE DRAWINGS

Like-numbered elements refer to common components in the different figures.

FIG. 4A is a block diagram of one embodiment of a memory structure having two planes.

FIG. 4B depicts a top view of a portion of one embodiment of a block of memory cells.

FIG. 4C depicts a cross sectional view of a portion of one embodiment of a block of memory cells.

FIG. 5E depicts threshold voltage distributions.
FIG. 5F depicts threshold voltage distributions.

DETAILED DESCRIPTION

Some non-volatile memory includes multiple planes on a same die. A plane contains multiple blocks that are connected to the same set of bit lines. In one embodiment, a block comprises multiple non-volatile memory cells (e.g., multiple NAND strings) connected to a common set of word lines. In some embodiments, a block is a unit of erase.

To increase the speed in which data is programmed (i.e. written or stored), data is concurrently programmed to multiple planes of a multi-plane memory. However, not all planes program data at the same speed. For example, due to variations in the manufacturing process (or other variations) some planes may program faster than others. When data is concurrently programmed to multiple planes, the total time to complete the programming is determined by the slowest plane. Therefore, to increase the speed of programming of a multi-plane memory, it is proposed to accelerate the programming of the last one or more data states for one or more slow planes. For example, after the slow plane completes programming for all but the last data state, an enhanced program operation (e.g., accelerated programming) can be applied for the last data state for the slow plane. Since the programming time in multi-plane mode is dependent on the slowest plane, the proposed technology efficiently reduces the programming time.

One embodiment comprises a plurality of non-volatile memory cells arranged in multiple planes and a control circuit connected to the multiple planes. The control circuit is configured to perform a programming process to concurrently program data into the multiple planes including performing a first portion of the programming process concurrently for the multiple planes and performing a second portion of the programming process. The control circuit is configured to identify a slow plane of the multiple planes based on the first portion of the programming process and increase the speed of programming for the slow plane relative to another plane of the multiple planes during the second portion of the programming process.

Figure 1:
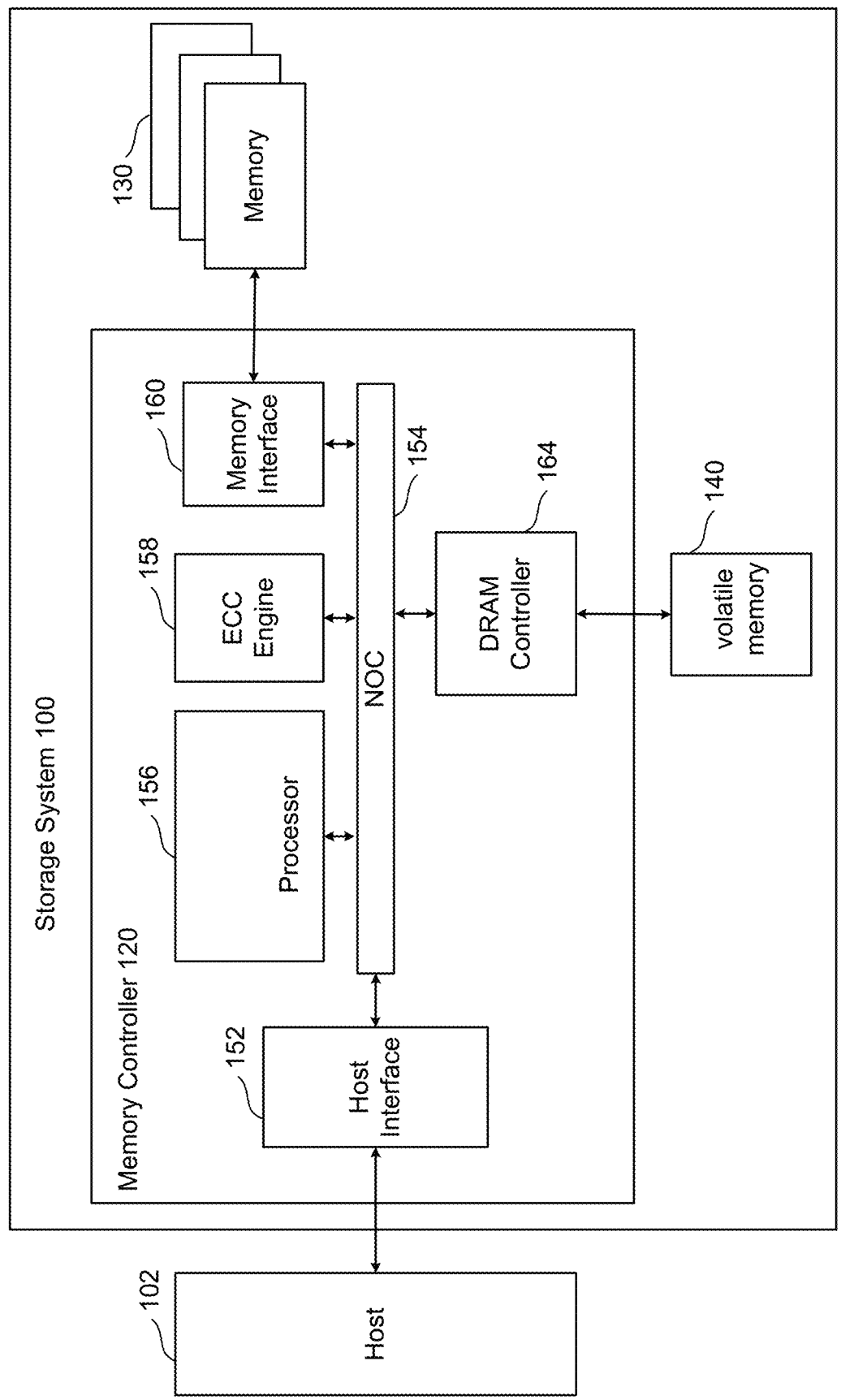
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
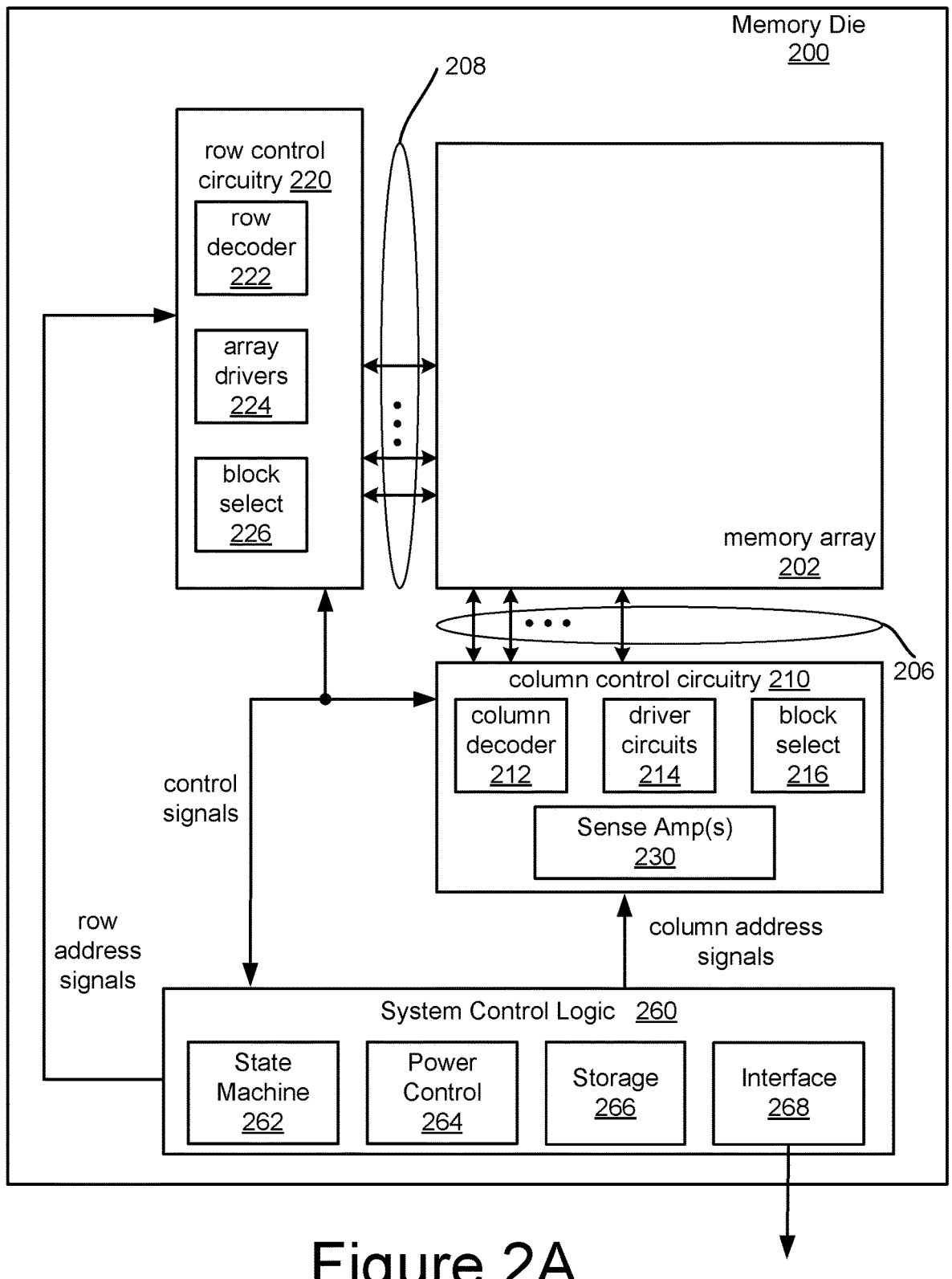
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory structure 202 (e.g. memory array) that can comprise multiple planes of non-volatile memory cells, as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory structure 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory structure 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory structure/array architecture or memory cell included in memory structure 202 is not limited to the examples above. Many different types of memory structure/array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all the components depicted in FIG. 2A other than memory structure 202. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
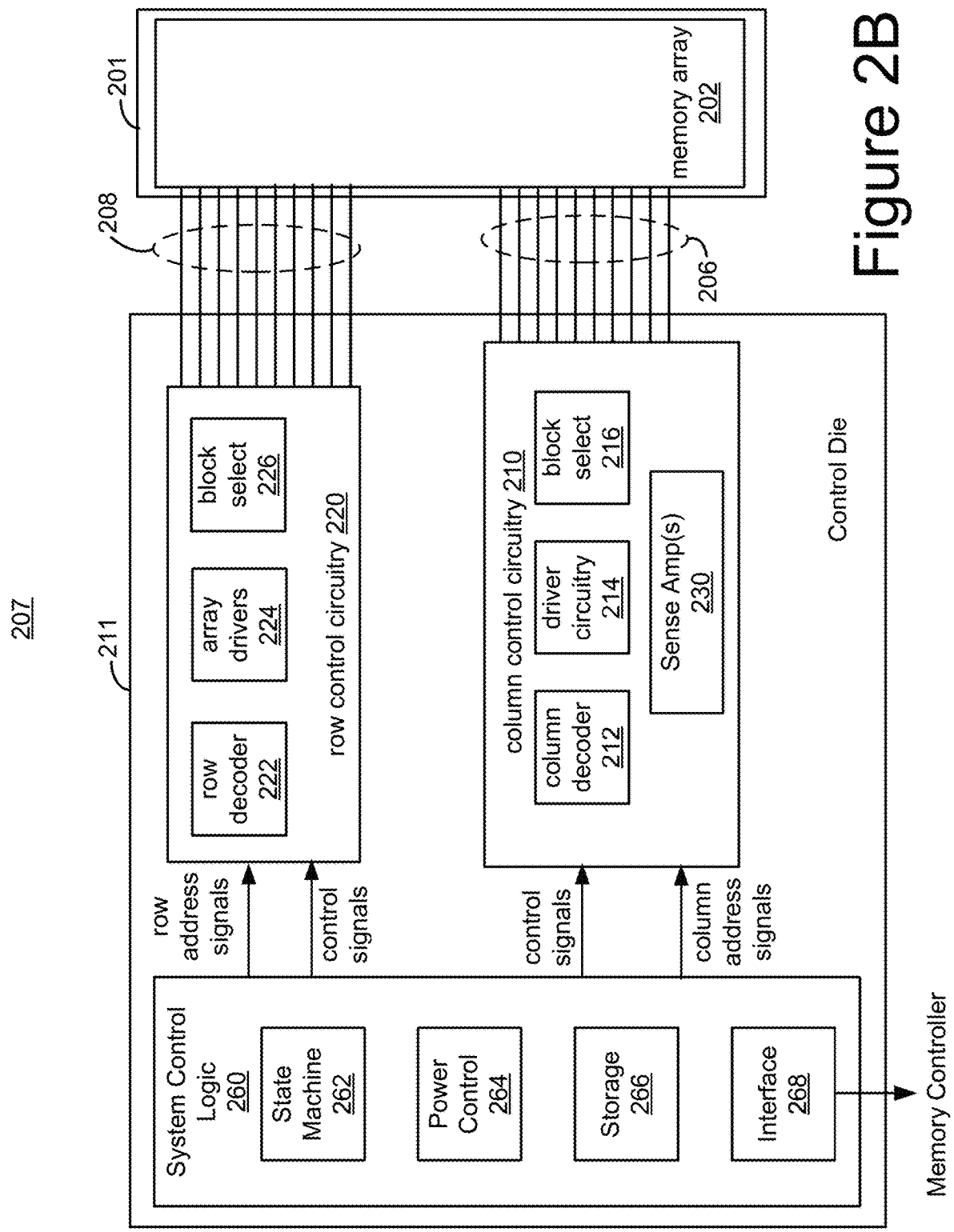
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201.

In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 306, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 3A:
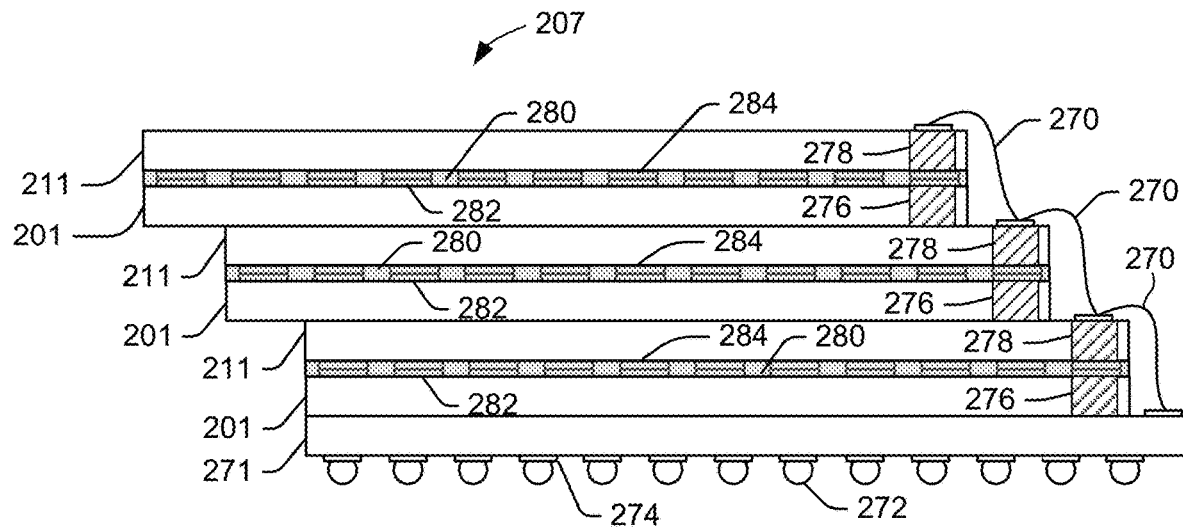
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211 via the bond pads, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
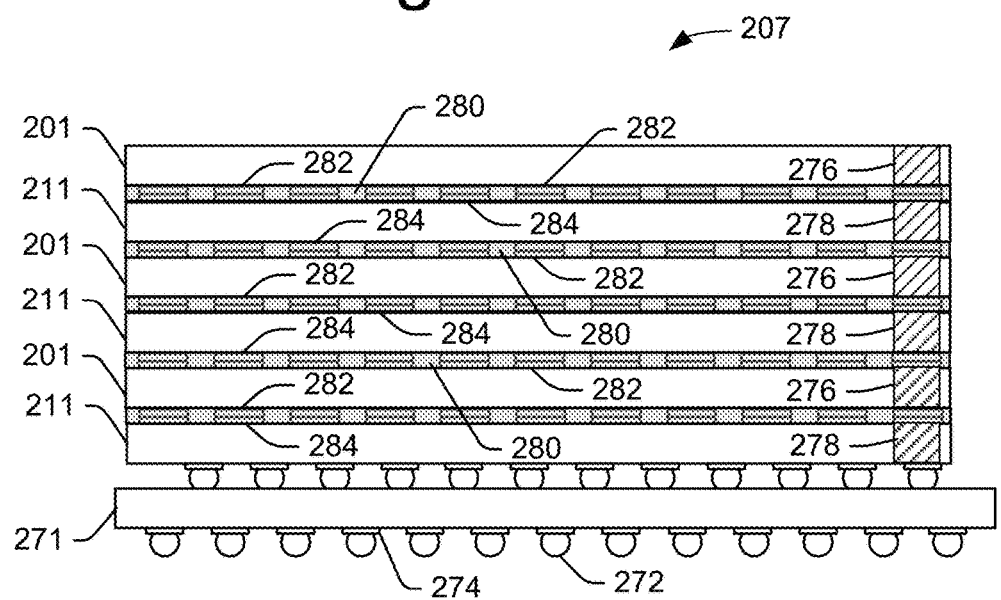

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
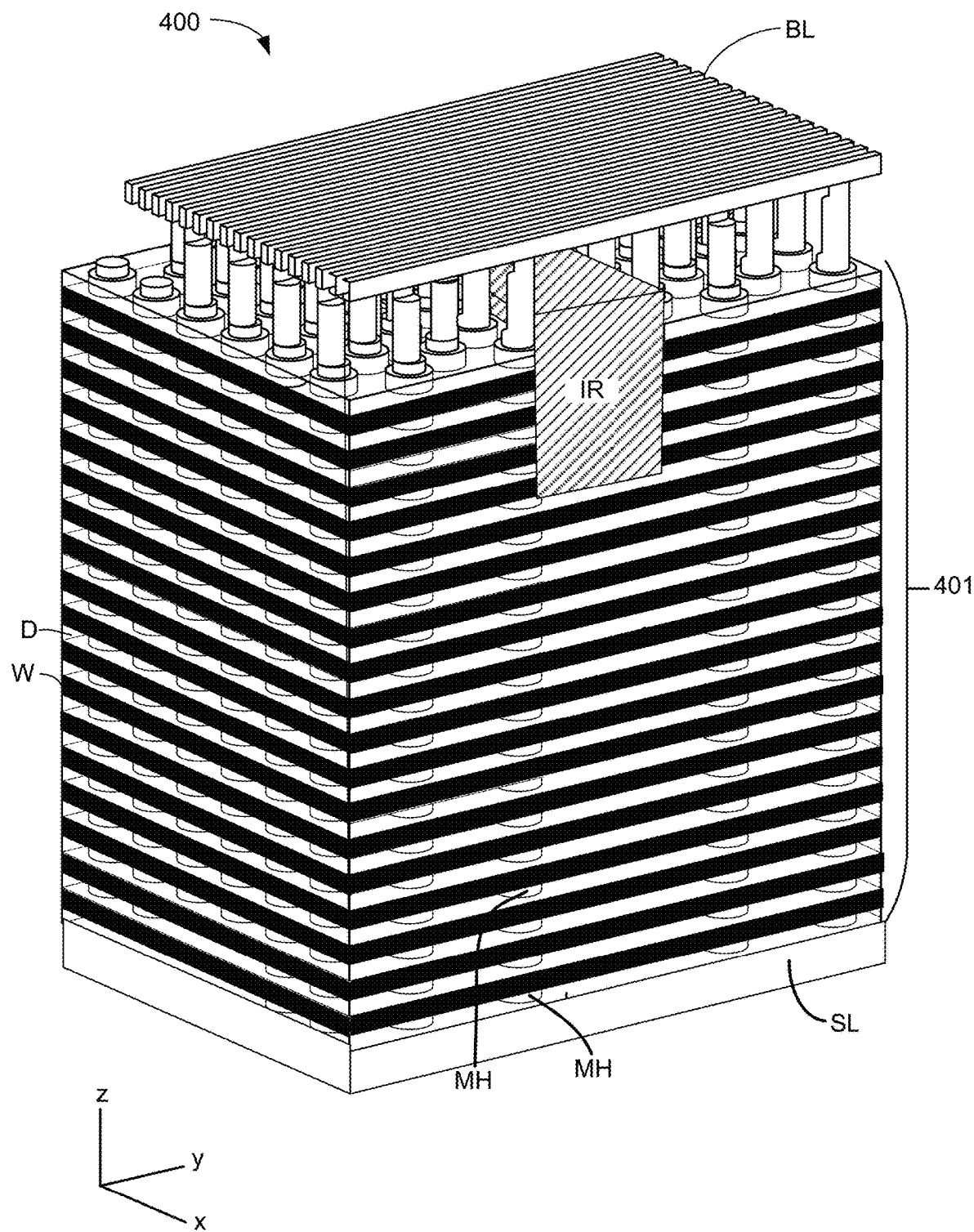
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

FIG. 4A is a block diagram explaining one example organization of memory structure 202, which is divided into two planes 402 and 404. Each plane is then divided into M blocks. In one embodiment, a plane contains multiple blocks that are connected to the same set of bit lines. In one embodiment, a block comprises multiple non-volatile memory cells (e.g., multiple NAND strings) connected to a common set of word lines. In some embodiments, a block is a unit of erase. In some embodiments, the NAND strings of a block are erased together. In one example, each plane has about 2000 blocks. However, different numbers of blocks can also be used. In some embodiments, blocks can be divided into sub-blocks and the sub-blocks can be the unit of erase. Memory cells can also be grouped into blocks for other reasons, such as to organize the memory structure to enable the signaling and selection circuits. Although FIG. 4A shows two planes 402/404, more or less than two planes can be implemented. In some embodiments, memory structure 202 includes eight or more planes.

FIGS. 4B-4J depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory structure/array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 426, 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of SiO$_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470 all of which are referred to as sub-blocks. In one embodiment, the isolation regions only divide the layers used to implement select gates so that NAND strings in different sub-blocks can be independently selected. In one example implementation, a bit line only connects to one vertical column/NAND string in each of regions (sub-blocks) 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

FIG. 4C depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). The structure of FIG. 4C includes three drain side select layers SGD0, SGD1 and SGD2; three source side select layers SGS0, SGS1, and SGS2; three dummy word line layers DD0, DD1, and DDS; two hundred and forty word line layers WL0-WL239 for connecting to data memory cells, and two hundred and fifty dielectric layers DL0-DL249. Other embodiments can implement more or less than the numbers described above for FIG. 4C. In one embodiment, SGD0, SGD1 and SGD2 are connected together; and SGDS0, SGS1 and SGS2 are connected together.

Vertical columns 472 and 474 are depicted protruding through the drain side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 442 has a source end at a bottom of the stack and a drain end at a top of the stack. As in agreement with FIG. 4B, FIG. 4C show vertical column 442 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL249. For example, dielectric layers DL240 is above word line layer WL235 and below word line layer WL236. In one embodiment, the dielectric layers are made from SiO$_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W239 connect to memory cells (also called data memory cells). Dummy word line layers DD0, DD1 and DS connect to dummy memory cells. A dummy memory cell does not store and is not eligible to store host data (data provided from the host or entity outside of the storage system 100), such as data from a user of the host), while a data memory cell is eligible to store host data. Host data can be contrasted with system data that is generated by memory system 100 (e.g., L2P tables). In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

Note that the stack of word lines WL0-WL239 include two edge word lines at the edges of the stack, including top edge word line WL239 and bottom edge word line WL0. Word lines WL1-WL238 are non-edge word lines.

Figure 4D:
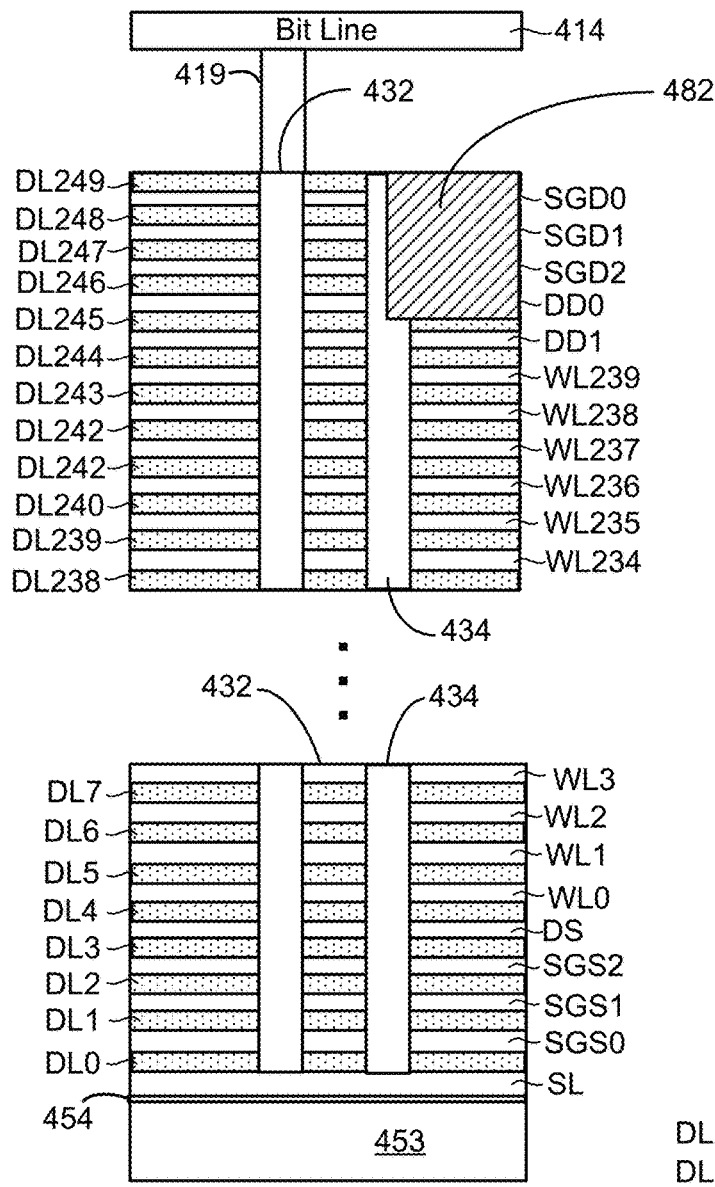
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 480, 482, 484, 486 and 488) occupy space that would have been used for a portion of the memory holes/vertical columns/NAND stings. For example, isolation region 482 occupies space that would have been used for a portion of vertical column 434. More specifically, a portion (e.g., half the diameter) of vertical column 434 has been removed in layers SDG0, SGD1, SGD2, and DD0 to accommodate isolation region 482. Thus, while most of the vertical column 434 is cylindrical (with a circular cross section), the portion of vertical column 434 in layers SDG0, SGD1, SGD2, and DD0 has a semi-circular cross section. In one embodiment, after the stack of alternating conductive and dielectric layers is formed, the stack is etched to create space for the isolation region and that space is then filled in with $SiO_2$.

Figure 4E:
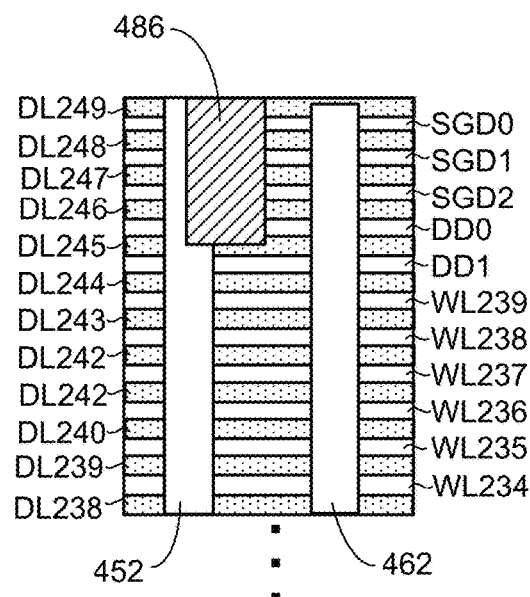
FIG. 4E depicts a cross sectional view of a portion of one embodiment of a block of memory cells.

FIG. 4E depicts a portion of one embodiment of a three dimensional memory structure 202 showing a cross-sectional view along line CC of FIG. 4B. This cross sectional view cuts through vertical columns (NAND strings) 452 and 4624 (see FIG. 4B). FIG. 4E shows the same alternating conductive and dielectric layers as FIG. 4C. FIG. 4E also shows isolation region 486 cutting into vertical columns (NAND string) 452.

Figure 4F:
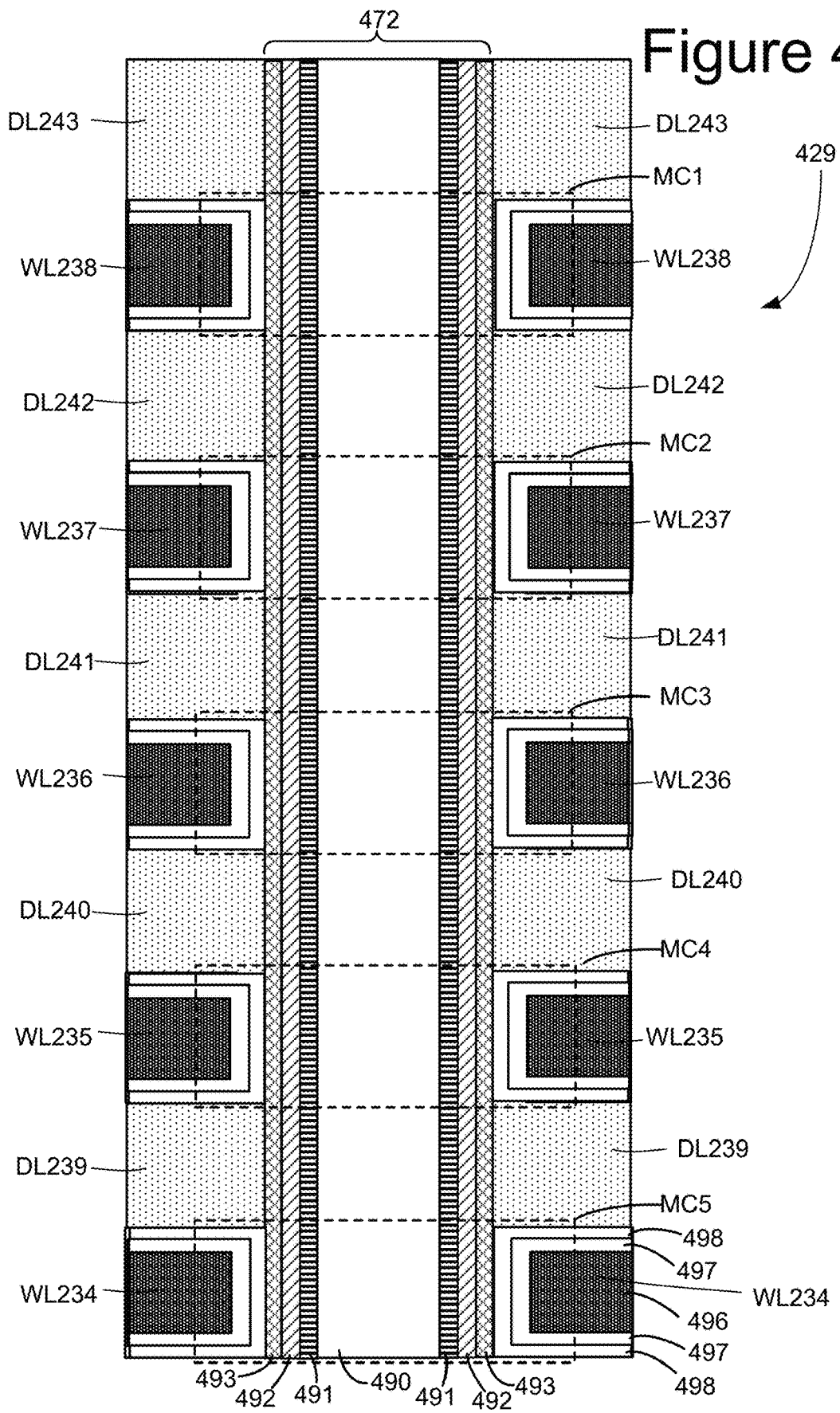
FIG. 4F is a cross sectional view of one embodiment of a vertical column of memory cells.

FIG. 4F depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4F depicts dielectric layers DLL239, DLL240, DLL241, DLL242 and DLL243, as well as word line layers WLL234, WLL235, WLL236, WLL237, and WLL238. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WLL238 and a portion of vertical column 472 comprise a memory cell MC1. Word line layer WL237 and a portion of vertical column 472 comprise a memory cell MC2. Word line layer WLL236 and a portion of vertical column 472 comprise a memory cell MC3. Word line layer WLL235 and a portion of vertical column 472 comprise a memory cell MC4. Word line layer WLL234 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4G:
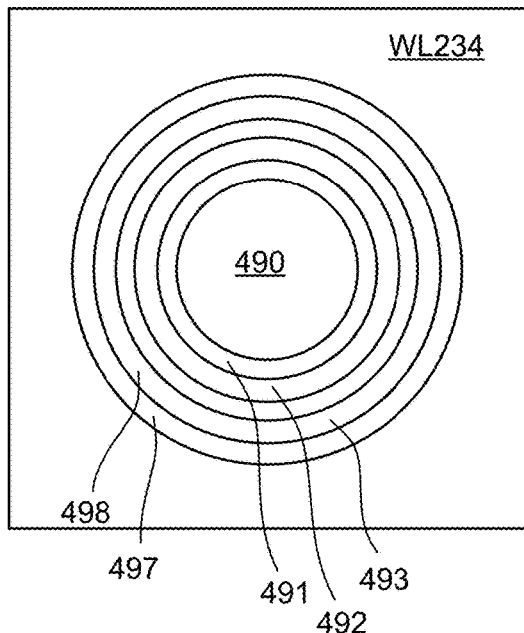
FIG. 4G depicts a cross section of a vertical column that implements a vertical NAND string.

FIG. 4G shows a cross section of vertical column 472 of FIG. 4F, cut through MC5. Thus, FIG. 4G depicts word line layer WL234, inner core 490, channel 491, tunneling dielectric 492, charge trapping layer 493, aluminum oxide layer 497, and blocking oxide layer 498.

Figure 4H:
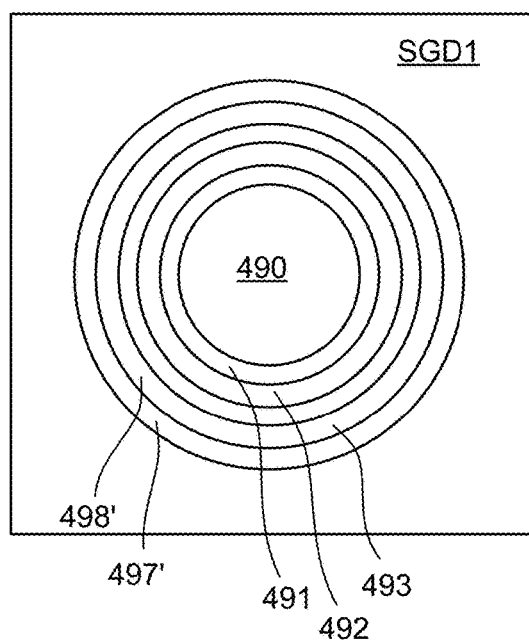
FIG. 4H depicts a cross section of a vertical column that implements a vertical NAND string.

FIG. 4H shows a cross section of vertical column 472 of FIG. 4F, cut through SGD1 (a select gate layer implementing a select gate). Thus, FIG. 4H depicts drain side select line layer SGD1, inner core 490, channel 491, tunneling dielectric 492, charge trapping layer 493, aluminum oxide layer 497, and blocking oxide layer 498.

Figure 4I:
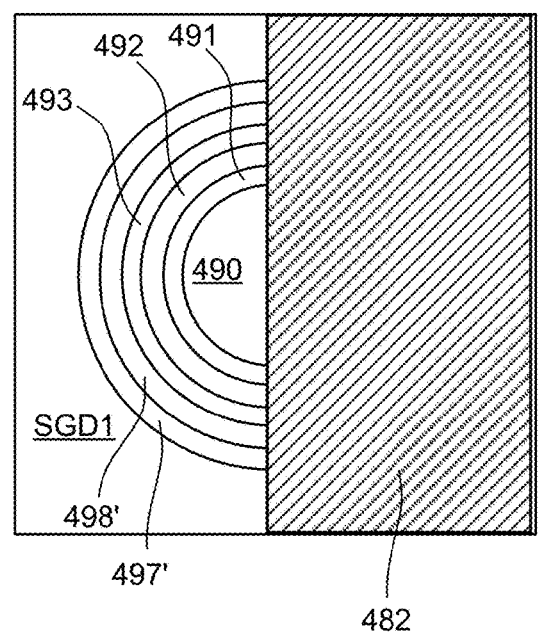
FIG. 4I depicts a cross section of a vertical column that implements a vertical NAND string.

FIG. 4I shows a cross section of vertical column 434 of FIG. 4D, cut through SGD1. Thus, FIG. 4I depicts drain side select line layer SGD1, inner core 490, channel 491, tunneling dielectric 492, charge trapping layer 493, aluminum oxide layer 497, and blocking oxide layer 498. FIG. 4I also shows a portion of isolation region 482. As can be seen in FIG. 4I, the select gate (select gate layer and select line layer) of vertical column 434 is semicircular in shape (or partially circular in shape) due to vertical column (NAND string) 434 intersecting isolation region 482.

Figure 4J:
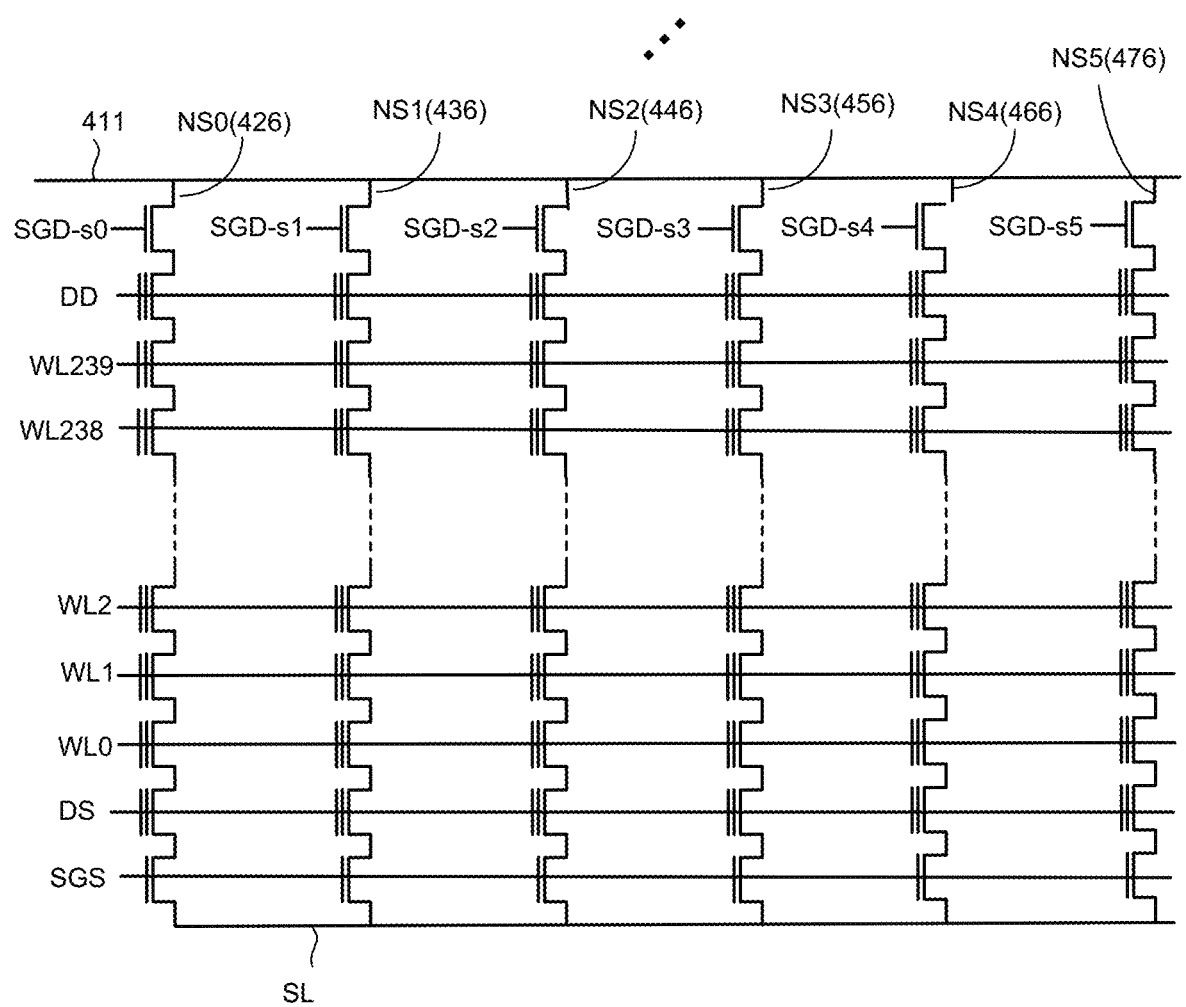
FIG. 4J is a schematic of a plurality of NAND strings in multiple sub-blocks of a same block.

FIG. 4J is a schematic diagram of a portion of the memory structure 202 depicted in in FIGS. 4-4I. FIG. 4J shows physical data word lines WL0-WL239 running across the entire block. The structure of FIG. 4J corresponds to a portion 306 in Block 2 of Figure A, including bit line 411. Within the block, in one embodiment, each bit line is connected to six NAND strings. Thus, FIG. 4J shows bit line connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each sub-block separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4E as SGS. Although the select gates SGD-s0, SGD-s1, SGD-s2, SGD-s3, SGD-s4, and SGD-s5 are isolated from each other due to the isolation regions, the data word lines WL0-WL239 of each sub-block are connected together.

The isolation regions (480, 482, 484, 486 and 486) are used to allow for separate control of sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. A sixth sub-block corresponds to those vertical NAND strings controlled by SGD-s5.

FIG. 4J only shows the NAND strings connected to bit line 411. However, a full schematic of the block would show every bit line and six vertical NAND strings connected to each bit line.

Although the example memories of FIGS. 4-4J are three dimensional memory structure that includes vertical NAND strings with charge-trapping material, other (2D and 3D) memory structures can also be used with the technology described herein.

Figure 5A:
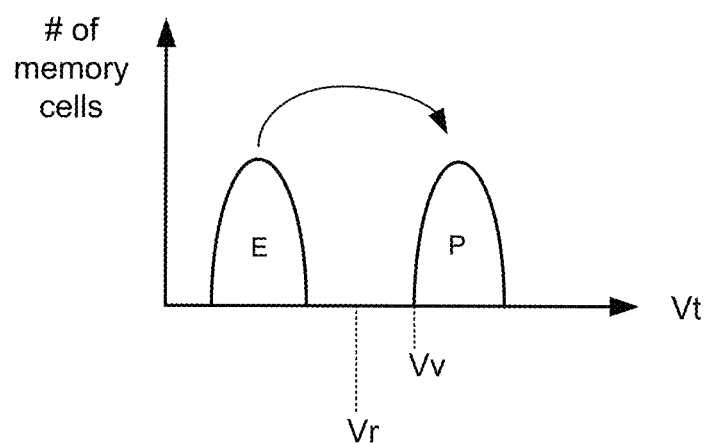
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory structure 202 when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read compare voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

FIGS. 5B-F illustrate example threshold voltage distributions for the memory structure 202 when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, five or six bits of data per memory cell).

Figure 5B:
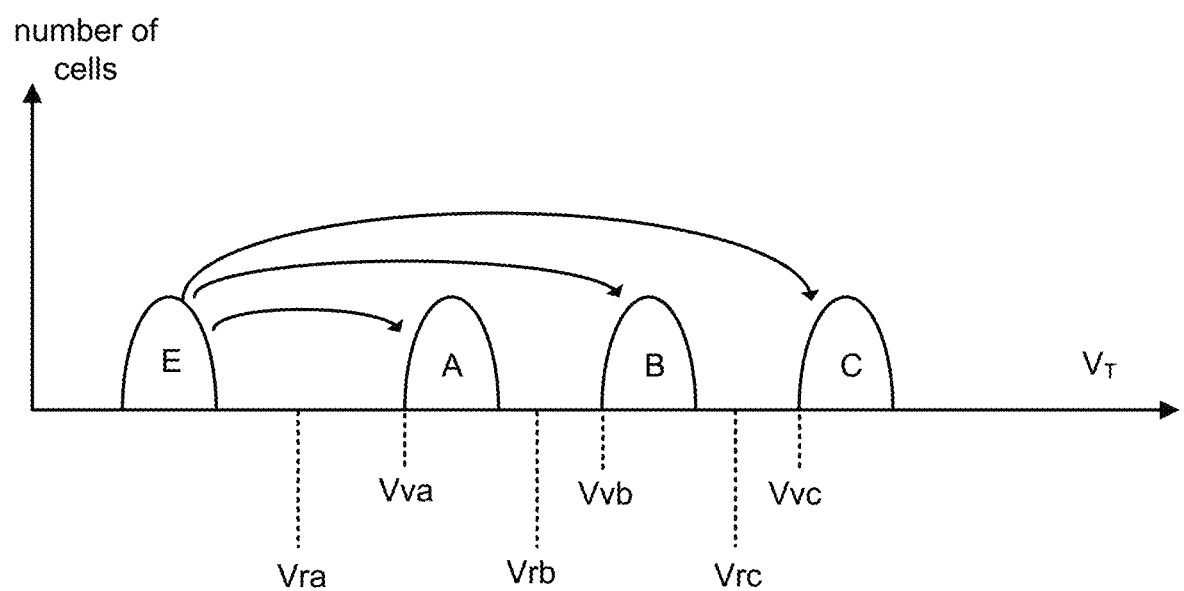
FIG. 5B depicts threshold voltage distributions.

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

Figure 5C:
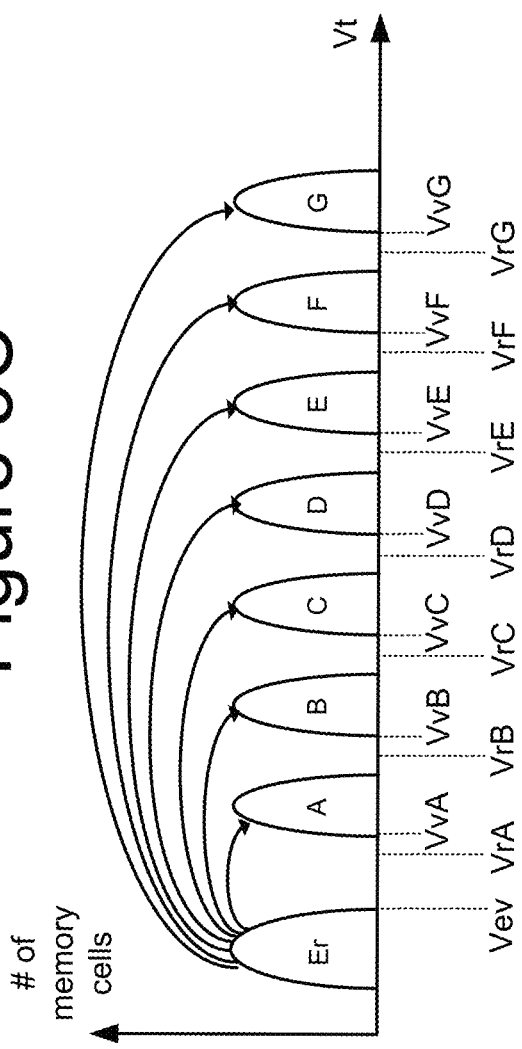
FIG. 5C depicts threshold voltage distributions.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|----|----|----|----|----|----|----|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read compare voltages, VrA, VrB, VrC, VrD, VrE, VrF, and VrG for reading data from memory cells. By testing (e.g., performing sense operations) whether the threshold voltage of a given memory cell is above or below the seven read compare voltages, the system can determine what data state (i.e., A, B, C, D, . . . ) a memory cell is in.

FIG. 5C also shows seven verify compare voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages VrA, VrB, VrC, VrD, VrE, VrF, and VrG, of FIG. 5C) or verify operation (e.g. see verify target voltages VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 5D:
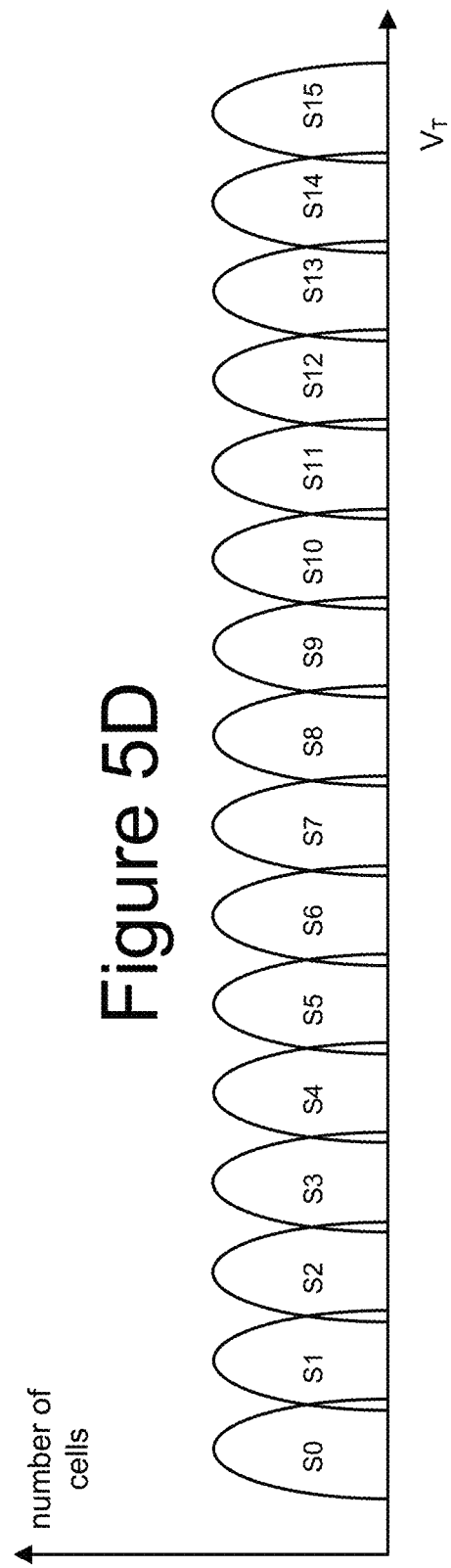
FIG. 5D depicts threshold voltage distributions.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read compare voltages can help to mitigate such effects. Using ECC during the read process can fix errors and ambiguities. Note that in some embodiments, the threshold voltage distributions for a population of memory cells storing four bits of data per memory cell do not overlap and are separated from each other; for example, as depicted in FIG. 5E. The threshold voltage distributions of FIG. 5D will include read compare voltages and verify compare voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 1 | 1 | 1 | 1 | 0 | 0 | 0 | 0 | 0 | 1 | 1 | 0 | 0 | 0 | 1 |
| UP | 1 | 1 | 0 | 0 | 0 | 0 | 0 | 0 | 1 | 1 | 1 | 1 | 1 | 1 | 0 | 0 |
| MP | 1 | 1 | 1 | 0 | 0 | 0 | 0 | 1 | 1 | 0 | 0 | 0 | 0 | 1 | 1 | 1 |
| LP | 1 | 0 | 0 | 0 | 1 | 1 | 0 | 0 | 0 | 0 | 0 | 1 | 1 | 1 | 1 | 1 |

FIG. 5F depicts threshold voltage distributions when each memory cell stores five bits of data, which is another example of MLC data. In one example implementation, when memory cells store five bits of data, the data is stored in any of thirty two data state (e.g., S0-S31).

Figure 6:
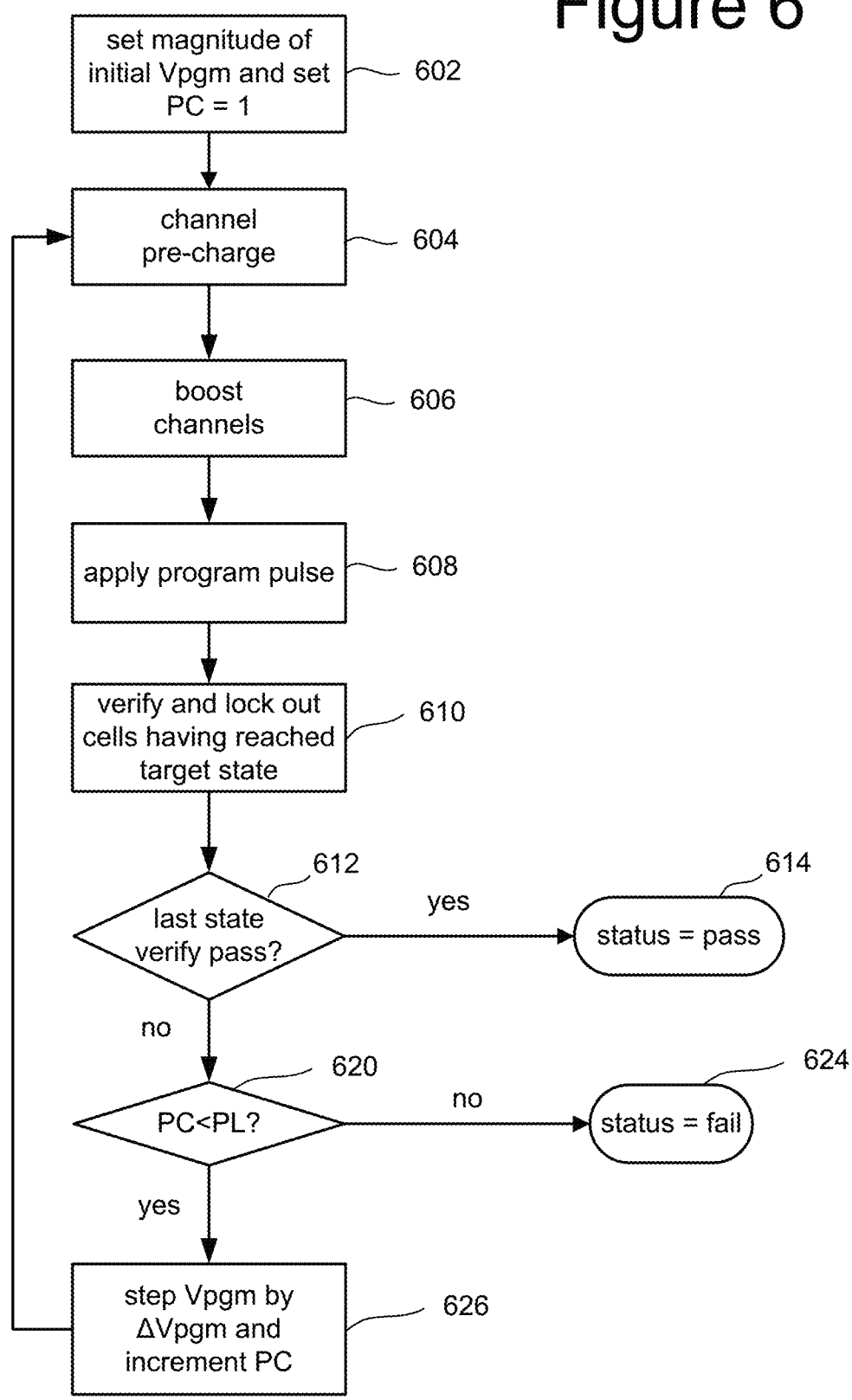
FIG. 6 is a flow chart describing one embodiment of a process for programming non-volatile memory.

FIG. 6 is a flowchart describing one embodiment of a standard process for programming memory cells. For purposes of this document, the term program and programming are synonymous with write and writing. In one example embodiment, the process of FIG. 6 is performed for memory structure 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-pass programming. When implementing multi-pass programming, the process of FIG. 6 is used to implement any/each pass of the multi-pass programming process.

Typically, the program voltage applied to the control gates (via a selected data word line) during a program operation is applied as a series of program voltage pulses. Between program voltage pulses are a set of verify pulses (e.g., voltage pulses) to perform verification. In many implementations, the magnitude of the program voltage pulses (also referred to as program pulses or programming pulses) is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts), also referred to as pass voltages, to perform boosting schemes. A program inhibit voltage is applied to the bit lines coupled the unselected NAND string. In one embodiment, for example, the channel is pre-charged to ~2 volts in step 604 and then floated. In step 606, the channel is boosted up from the 2 volts to a boosting voltage of approximately 8-10 volts.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify compare levels. In one embodiment, the verification process is performed by testing whether the threshold voltages of the memory cells selected for programming have reached the appropriate verify compare voltage. In step 610, a memory cell may be locked out after the memory cell has been verified (by a test of the Vt) that the memory cell has reached its target state.

In step 612, it is determined whether all of the memory cells targeted to be programmed to the last data state (e.g., state G of FIG. 5C or state S15 of FIG. 5D) have reached their target threshold voltage. For example, if all memory cells targeted to be programmed to data state G have their threshold voltage greater than VvG, then the programming process is complete and a status of "PASS" is reported in step 614. Otherwise, if in step 612 it is determined that not all of the memory cells targeted to the last data state have reached their target threshold voltage, then the programming process continues at step 620. In one embodiment, step 612 includes counting the number of memory cells targeted to the last data state that have not reached their target threshold voltage and if that number is low enough (less than the capacity of the ECC process to correct errors), then the system can determine that the programming process is complete and successful.

In another embodiment, at the start of the process of FIG. 6 step 612 is performed by counting the number of memory cells targeted to the first data state (e.g., data state A) that have not reached their target threshold voltage and if that number is low enough (less than the capacity of the ECC process to correct errors), then the system determines that the programming process is complete for data state A and future performances of step 612 includes by counting the number of memory cells targeted to the next data state (e.g., data state B) that have not reached their target threshold voltage and if that number is low enough (less than the capacity of the ECC process to correct errors), then the system determines that the programming process is complete for data state B and future performances of step 612 includes by counting the number of memory cells targeted to the next data state (e.g., data state C), and so on.

In step 620, the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another iteration (steps 604-626) of the programming process of FIG. 6 is performed.

In some embodiments, memory cells are programmed in an order from the source side to the drain side. For example, first the process of FIG. 6 is performed to program memory cells connected to WL0, followed by using the process of FIG. 6 to program memory cells connected to WL1, followed by using the process of FIG. 6 to program memory cells connected to WL2, followed by using the process of FIG. 6 to program memory cells connected to WL3, . . . followed by using the process of FIG. 6 to program memory cells connected to WL239.

In another embodiment, memory cells are programmed in an order from the drain side to the source side. For example, first the process of FIG. 6 is performed to program memory cells connected to WL239, followed by using the process of FIG. 6 to program memory cells connected to WL238, followed by using the process of FIG. 6 to program memory cells connected to WL237, followed by using the process of FIG. 6 to program memory cells connected to WL236, . . . followed by using the process of FIG. 6 to program memory cells connected to WL1, followed by using the process of FIG. 6 to program memory cells connected to WL0.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to or near a bit line to generate a first GIDL current. A second GIDL voltage may be created between two terminals of a select transistor (e.g., source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 7:
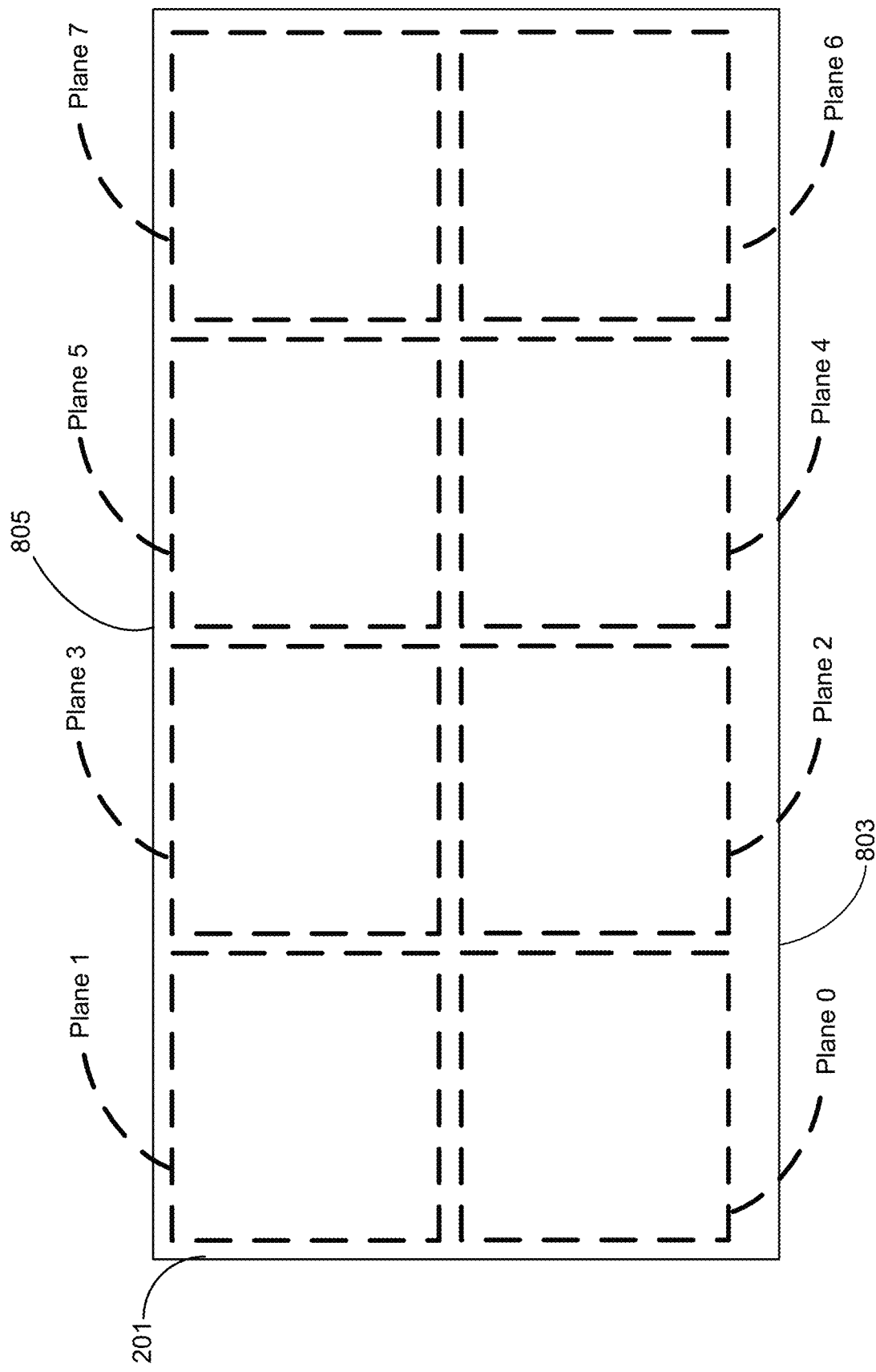
FIG. 7 is a top view of the planes of a memory die.

FIG. 7 depicts a top view of a memory die 201 of an integrated memory assembly 207 that includes eight planes: Plane 0, Plane 1, Plane 2, Plane 3, Plane 4, Plane 5, Plane 6 and Plane 7. In other embodiments, more or less than eight planes can be implemented. In one example implementation, each plane includes a three dimensional non-volatile memory array (or other type of memory structure). Each of the three dimensional non-volatile memory arrays/structures includes bit lines and word lines connected to non-volatile memory cells, as described above.

Figure 8:
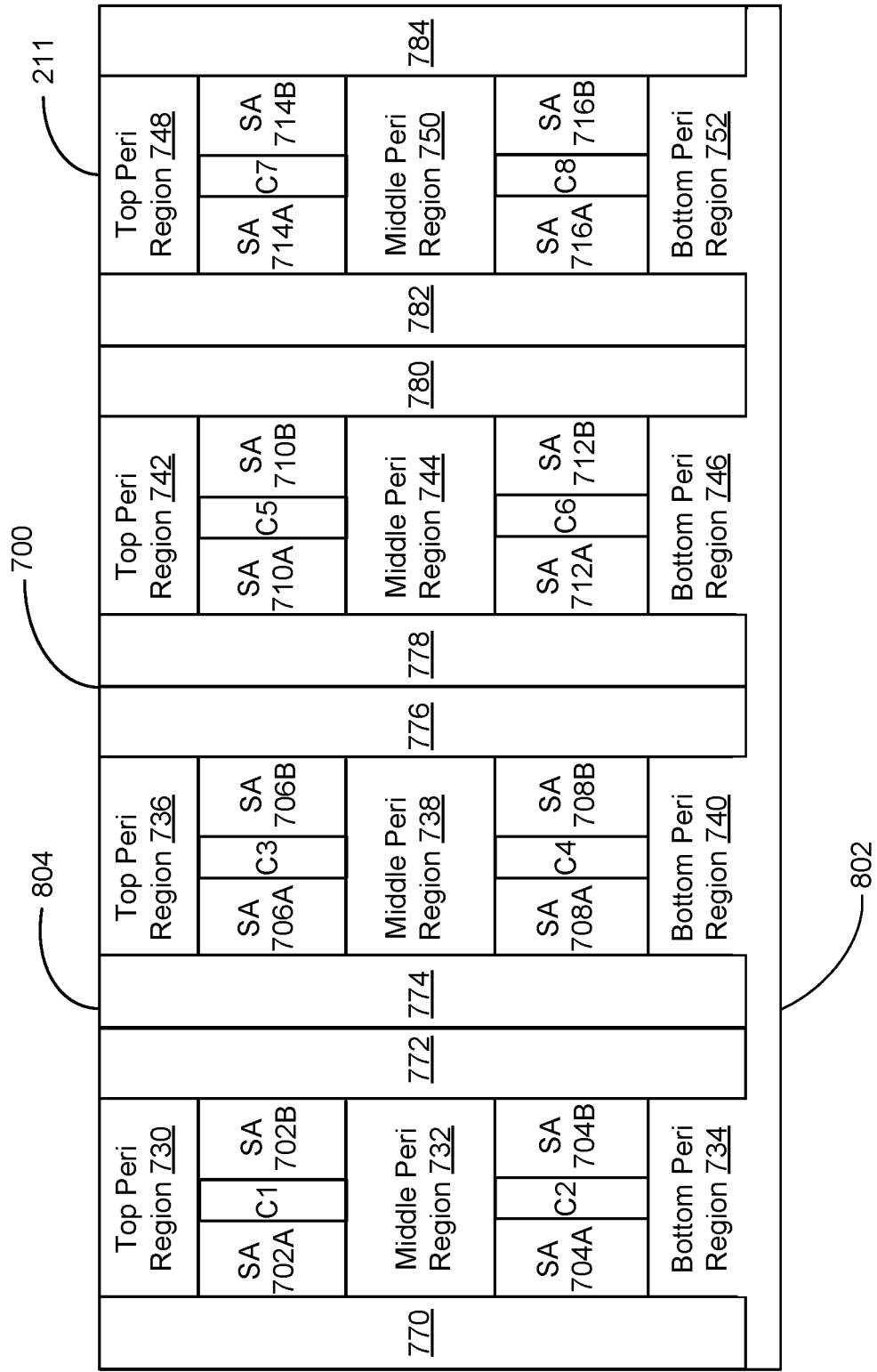
FIG. 8 is a top view of the circuits on a control die.

FIG. 8 depicts a top view of control die 211 of an integrated memory assembly 207. Particularly, FIG. 8 is looking down on the top surface of substrate 700 of control die 211. The top surface 700 of the substrate is divided into various areas including a plurality of word line switch regions 770, 772, 774, 776, 778, 780, 782 and 784. Each of these word line switch regions includes a plurality of word line switches that connect word lines to voltage sources. Control die 211 also includes a plurality of sense amplifier regions 702A, 702B, 704A, 704B, 706A, 706B, 708A, 708B, 710A, 710B, 712A, 712B, 714A, 714B, 716A and 716B. Each of the sense amplifiers regions includes sense amplifiers and supporting circuits. Control die 211 further includes a plurality of peripheral circuit regions (also referred to as Peri regions) 730, 732, 734, 736, 738, 740, 742, 744, 746, 748, 750 and 752. Each of the Peri regions includes various peripheral circuits (other than sense amplifiers and word line switch transistors) used to implement control die 211. For example, Peri regions 730, 732, 734,

736, 738, 740, 742, 744, 746, 748, 750 and 752 could include the components of system control logic 260, components of row control circuitry 220, and/or the components of column control circuitry 210 (except for sense amps 230) (see FIG. 2A and FIG. 2B). Control die 211 also includes other circuits C1-C8 between the sense amplifier regions.

Control die 802 has a first end 802, a second end 804 opposite the first end, and a middle that is between the first end and the second end. The Peri regions at the first end 802 are referred to as Bottom Peri regions (e.g., Bottom Peri Region 734, Bottom Peri Region 740, Bottom Peri Region 746, and Bottom Peri Region 752). The Peri regions at the second end 804 are referred to as Top Peri regions (e.g., Top Peri Region 730, Top Peri Region 736, Top Peri Region 742, and Top Peri Region 748). The Peri regions in the middle are referred to as Middle Peri regions (e.g., Middle Peri Region 732, Middle Peri Region 738, Middle Peri Region 744, and Middle Peri Region 750). Note that the memory die also has a corresponding first end 803, second end 805 opposite the first end, and a middle that is between the first end and the second end (see FIG. 7).

Figure 9:
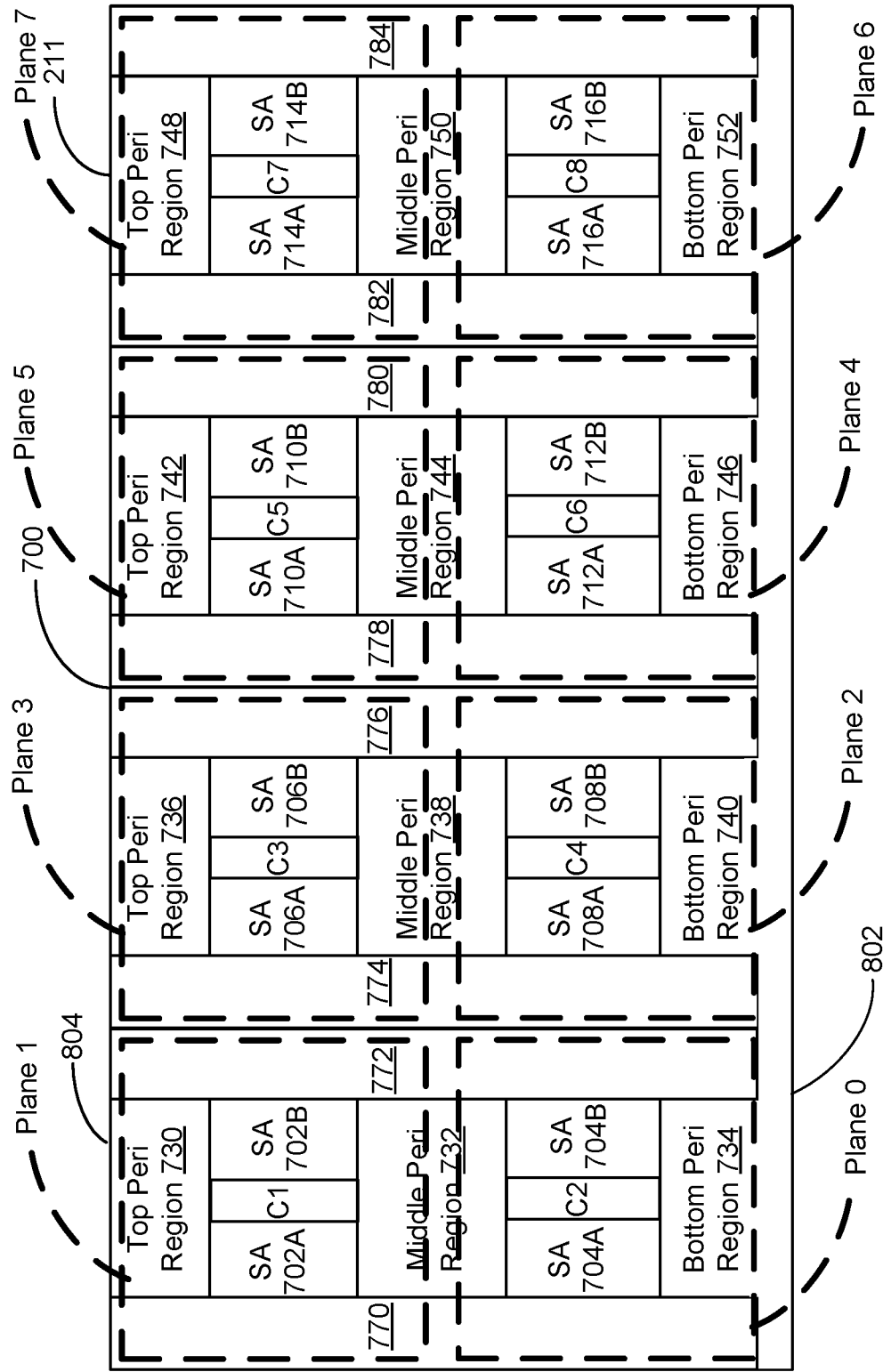
FIG. 9 is a top view of the circuits on a control die.

In one embodiment, control die 211 of FIG. 8 is positioned below memory die 201. That is, the eight planes depicted in FIG. 7 would be positioned above the components depicted in FIG. 8, as shown in FIG. 9.

As described above, some non-volatile memory includes multiple planes on a same die. To increase speed of operation, data is concurrently programmed to multiple planes of the multi-plane memory. However, not all planes program data at the same speed. For example, due to variations in the manufacturing process (or other variations) some planes may program faster than others. When data is concurrently programmed to multiple planes, the total time to complete the programming is determined by the slowest plane. Therefore, to increase the speed of programming of a multi-plane memory, it is proposed to accelerate the programming of the last one or more data states for one or more slow planes. For example, after the memory cells of the slow plane complete programming for all but the last data state, an enhanced program operation (e.g., accelerated programming) can be applied for the last data state for the memory cells of the slow plane.

Figure 10:
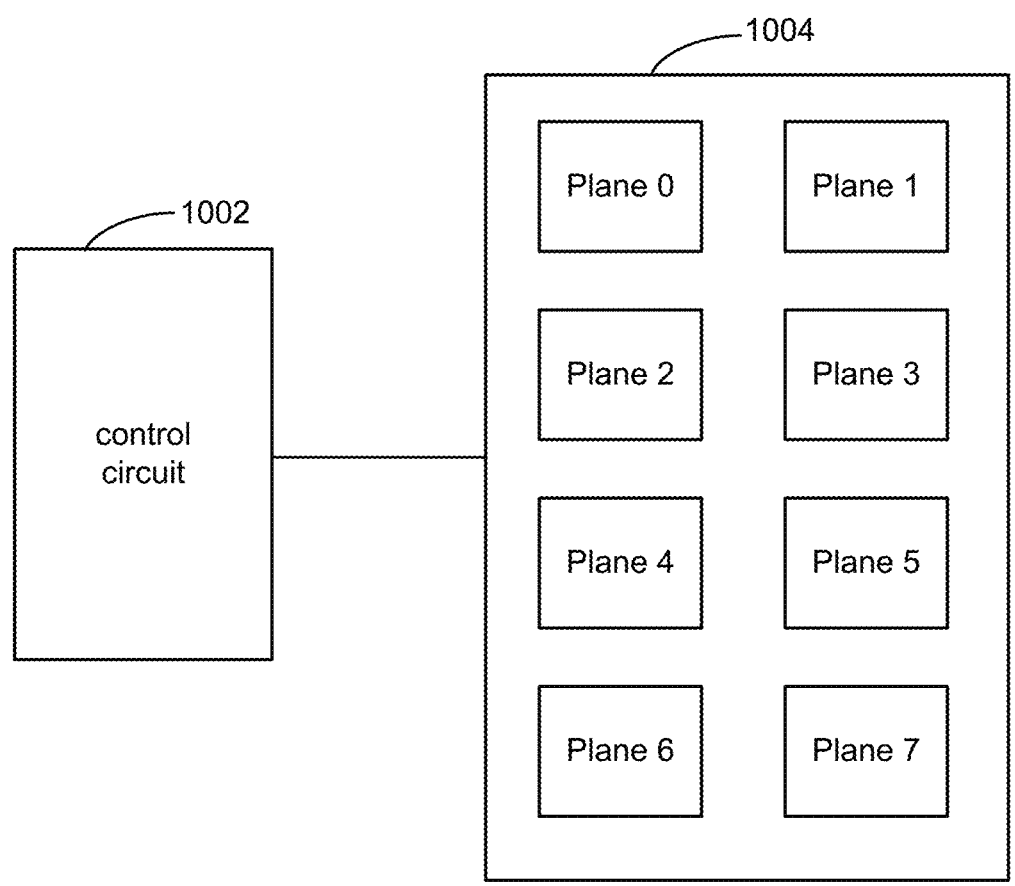
FIG. 10 is a block diagram of a portion of a non-volatile storage apparatus.

FIG. 10 is a block diagram of a portion of a non-volatile storage apparatus that accelerates the programming of the last one or more data states for one or more slow planes. The non-volatile storage apparatus of FIG. 10 includes a control circuit 1002 connected to multiple planes 1004 (e.g., Plane 0, Plane 1, Plane 2, Plane 3, Plane 4, Plane 5, Plane 6 and Plane 7) of non-volatile memory cells, where the non-volatile memory cells are implemented as any of the structures discussed above or other types of memory structures. Control circuit 1002 can be any of the embodiments of a control circuit discussed above. The control circuit 1002 is connected to the memory cells of the multiple planes via control lines such as word lines, bit lines, source line and/or select lines, as described above with respect to FIGS. 1-4J. Control circuit 1002 is configured to perform a programming process to concurrently program data into the multiple planes, including performing the processes of FIGS. 11-14, such that after the slow plane(s) completes programming for all but the last one or more data states an enhanced program operation (e.g., accelerated programming) can be applied for the last one or more data states for the slow plane(s).

Figure 11:
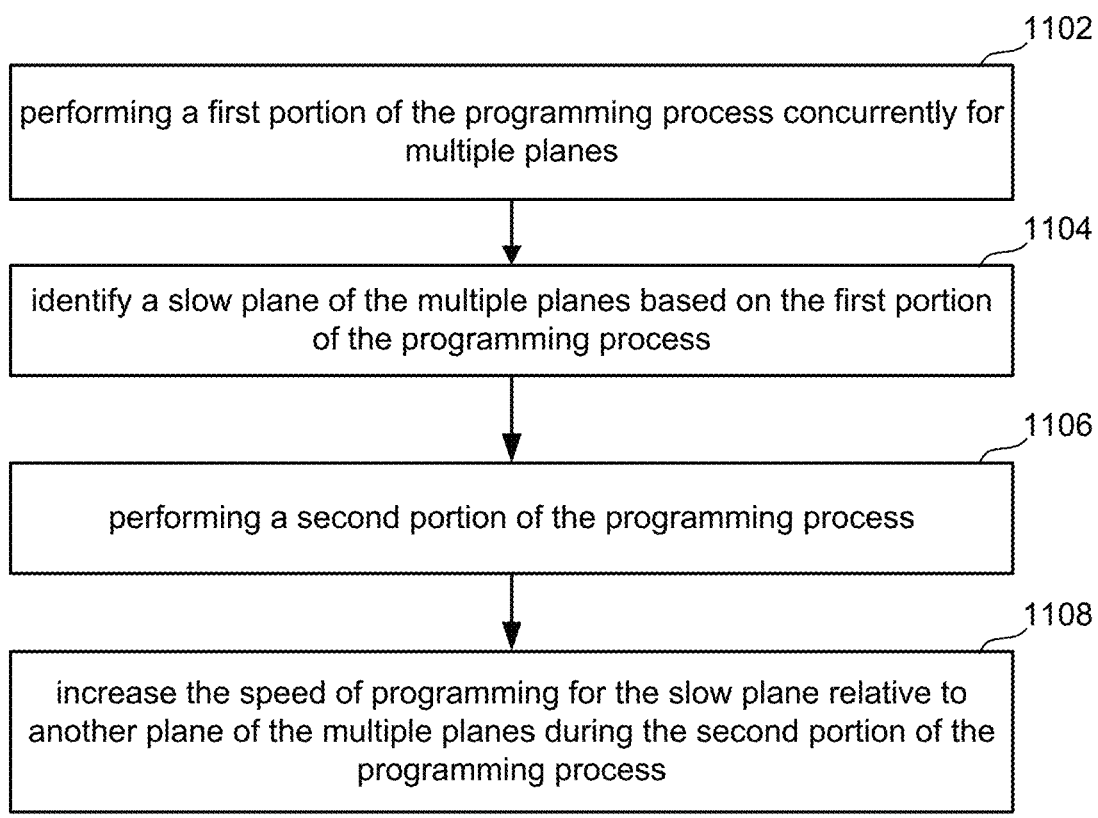
FIG. 11 is a flow chart of one embodiment of a process for programming.

FIG. 11 is a flow chart describing one embodiment of a process to concurrently program data into the multiple planes such that after the slow plane(s) completes programming for all but the last one or more data states an enhanced program operation (e.g., accelerated programming) can be applied for the last one or more data states for the slow plane(s). In one example embodiment, the process of FIG. 11 is performed by any of the embodiments of a control circuit discussed above. In one example embodiment, the process of FIG. 11 is performed by integrated memory assembly 207 using any of the embodiments of a control circuit discussed above of control die 211 to program memory cells (e.g., NAND strings of memory structure 202) on memory die 201. In one embodiment, the process of FIG. 11 is performed at the direction of state machine 262 (or another processor).

In step 1102 of FIG. 11, the control circuit performs a first portion of the programming process concurrently for multiple planes. For example, all or a portion of the process of FIG. 6 can be performed for memory cells storing one bit of data per memory cell, two bits of data per memory cell, three bits of data per memory cell, four bits of data per memory cell, etc. In step 1104, the control circuit identifies a slow plane of the multiple planes based on the first portion of the programming process. For example, the control circuit determines which one or more planes is/are programming slower than the other planes. In one example, the control circuit determines which plane's memory cells are experiencing the smallest change in threshold voltage per program pulse during step 1102. Many different tests can be used to identify the slow planes. More details of one example for identifying one or more slow planes is described below with respect to FIGS. 13 and 14. In step 1106, the control circuit performs a second portion of the programming process. For example, all or a portion of the process of FIG. 6 can be performed (or continued to be performed).

In step 1108, the control circuit increases the speed of programming for the slow plane relative to another plane of the multiple planes during the second portion of the programming process (e.g., during step 1106). For purposes of this document, increasing the speed of programming for the slow plane means that the memory cells of the slow plane program faster than they would have without the increasing of the speed of programming. In one example, increasing the speed of programming for the slow plane includes taking an action to cause the memory cells of the slow plane to experience a greater increase in threshold voltage in response to a program voltage pulse (see e.g., step 608) than they would have if no action was taken to increases the speed of programming for the slow plane. The increase in the speed of programming for the slow plane is relative to other planes that are not slow planes to reduce the slow plane's slowing down of the entire programming process. In some embodiments, this may mean only taking a measure to increase the speed of programming for the slow plane and the fast plane continues as planned. In other embodiments, this may mean increasing the speed for all planes but the increase in speed of the slow plane is greater than the increase in speed of a fast plane. That is, for example, when programming using a process similar to the process of FIG. 6 which increases the program voltage by a step size during each program loop/iteration (e.g., steps 604-626) of the programming process, the memory cells are programmed at a nominal (or expected) speed and step 1108 includes the control circuit programming memory cells of the slow plane at a speed that has been increased from a respective nominal (or expected) speed and programming memory cells of a plane other than the slow plane at a speed that has not been increased from a respective nominal speed during the second portion of the programming process.

When programming using a process similar to the process of FIG. 6 which increases the program voltage by a step size during each program loop/iteration (e.g., steps 604-626) of the programming process, each program loop/iteration will use a higher magnitude program voltage pulse which arguably may mean faster programming. The increasing the speed of programming of step 1108 includes further speeding up the programming in addition to the standard increases in the program voltage by the step size during each program loop/iteration.

In one embodiment of step 1108, the control circuit is configured to increase the speed of programming for the slow plane relative to another plane of the multiple planes during the second portion of the programming process by increasing a duration of the program voltage pulse (see e.g., step 608) for the slow plane during the second portion of the programming process. In another embodiment, the control circuit is configured to increase the speed of programming for the slow plane relative to another plane of the multiple planes during the second portion of the programming process by increasing a duration of the program voltage pulse for all planes and raising a bit line voltage connected to memory cells of planes other than the slow plane during the second portion of the programming process, where raising a bit line voltage slows down programming. In one example, the bit line voltage is raised such that the fast planes will program at the nominal speed (e.g., the speed without this new technology implemented). In another embodiment, the control circuit is configured to increase the speed of programming for the slow plane relative to another plane of the multiple planes during the second portion of the programming process by increasing the step size (e.g., ΔVpgm—see e.g., step 626) for memory cells of the slow plane that are being programmed during the second portion of the programming process. In another embodiment, the control circuit is configured to increase the speed of programming for the slow plane relative to another plane of the multiple planes during the second portion of the programming process by increasing the step size for all planes and raising a bit line voltage connected to memory cells of planes other than the slow plane during the second portion of the programming process. In one example, the bit line voltage is raised such that the fast planes will program at the nominal speed (e.g., the speed without this new technology implemented). In another embodiment, the control circuit is configured to increase the speed of programming for the slow plane relative to another plane of the multiple planes during the second portion of the programming process by lowering a bit line voltage to a negative voltage for memory cells of the slow plane that are being programmed during the second portion of the programming process, such that lowering the bit line voltage serves to increase the speed of programming.

Note that in one embodiment of the process of FIG. 11, the first portion of the programming process (step 1102) comprises the control circuit completing the programming process for a first subset of memory cells of the plurality of non-volatile memory cells arranged in multiple planes that are targeted to a first set of data states and the second portion of the programming process (step 1106) comprises the control circuit completing the programming process for a second subset of memory cells of the plurality of non-volatile memory cells arranged in multiple planes that are targeted to a second set of data states, the second set of one or more data states are higher in threshold voltage than the first set of data states. For example, the first portion of the programming process may include starting programming for all selected memory cells (e.g., first and second subset of memory cells) to store three bits of data per memory cell, and completing the programming for all memory cells targeted to data states A-F (see e.g., FIG. 5C), and the second portion of the programming process includes completing the programming of memory cells targeted to the last data state (e.g., data state G of FIG. 5C). The last data state (e.g., data state G of FIG. 5C) is higher in threshold voltage than the first set of data states (e.g., data states A-F of FIG. 5C), as depicted in FIG. 5C. In one embodiment, the second portion of the programming process comprises the control circuit only performing the programming process for memory cells of the plurality of non-volatile memory cells arranged in multiple planes that are targeted to a last data state. In one embodiment, the second portion of the programming process includes completing the programming of memory cells targeted to the last data state (e.g., data state S15 of FIG. 5E or data state S31 of FIG. 5F) and one or more additional data states (e.g., data states S13-S14 of FIG. 5E or data states S28-S30 of FIG. 5F).

In one embodiment, the control circuit is configured to perform the programming process (e.g., steps 1102 and 1106) by performing multiple program loops (see e.g., FIG. 6), each program loop comprises the control circuit applying a program voltage pulse to the plurality of non-volatile memory cells (see e.g., step 608) and performing program verification see e.g., step 610) for at least a subset of the plurality of non-volatile memory cells. The control circuit is configured to identify a slow plane of the multiple planes based on the first portion of the programming process (step 1102) by counting a number of program loops performed for each plane after all memory cells of the respective plane that are targeted to the first set of data states (e.g., data states A-F of FIG. 5C) have completed the programming process and before all planes have completed the first portion of the programming process, and identifying the slow plane as a plane with a smallest number of program loops performed after all memory cells of the respective plane that are targeted to the first set of data states have completed the programming process and before all planes have completed the first portion of the programming process. More details are described below with respect to FIGS. 13 and 14.

Figure 12:
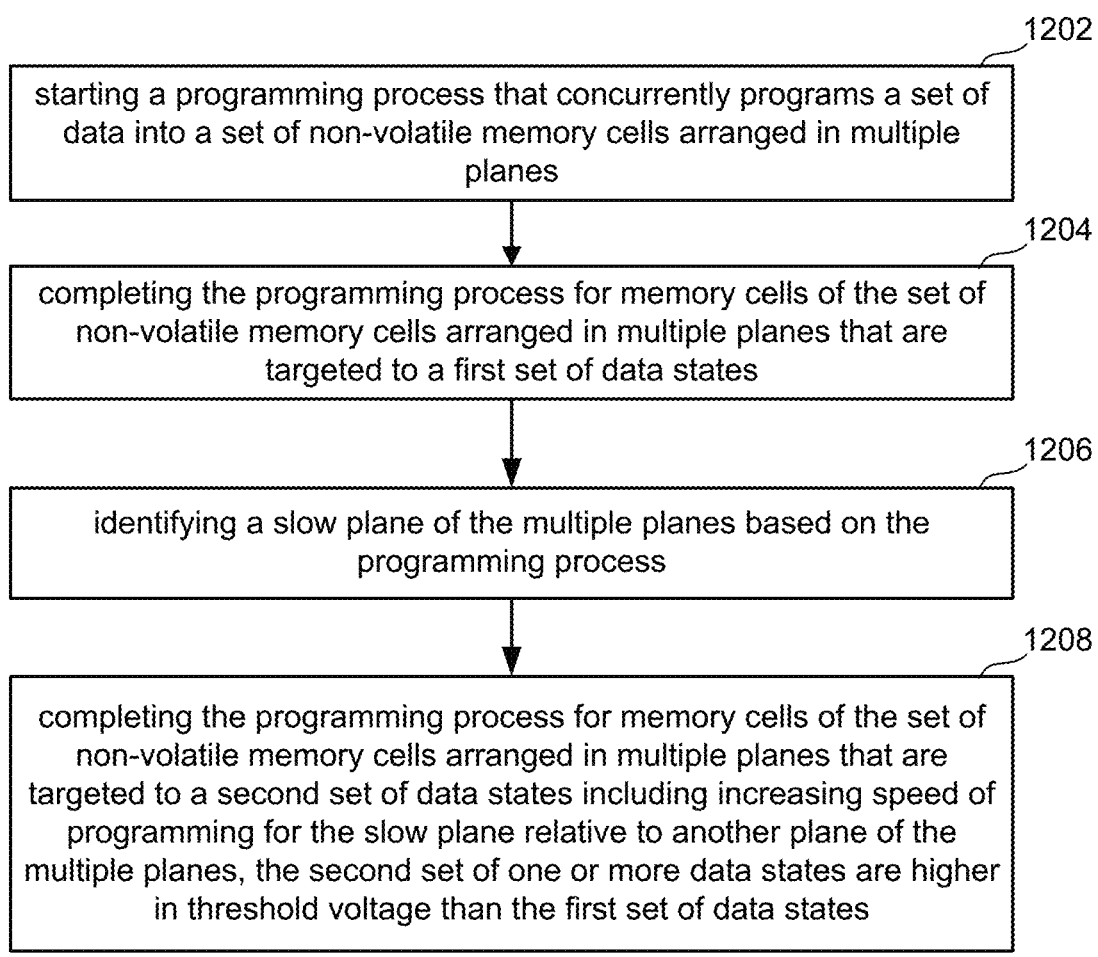
FIG. 12 is a flow chart of one embodiment of a process for programming.

FIG. 12 is a flow chart describing another embodiment of a process to concurrently program data into the multiple planes such that after the slow plane(s) completes programming for all but the last one or more data states an enhanced program operation (e.g., accelerated programming) can be applied for the last one or more data states for the slow plane(s). That is, the process of FIG. 12 is another embodiment of the process of FIG. 11. In one example embodiment, the process of FIG. 12 is performed by any of the embodiments of a control circuit discussed above. In one example embodiment, the process of FIG. 12 is performed by integrated memory assembly 207 using any of the embodiments of a control circuit discussed above of control die 211 to program memory cells (e.g., NAND strings of memory structure 202) on memory die 201. In one embodiment, the process of FIG. 12 is performed at the direction of state machine 262 (or another processor).

In step 1202 of FIG. 12, the control circuit, starts a programming process that concurrently programs a set of data into a set of non-volatile memory cells arranged in multiple planes. In step 1204, the control circuit completes the programming process for memory cells of the set of non-volatile memory cells arranged in multiple planes that are targeted to a first set of data states (e.g., data states A-F of FIG. 5C). Steps 1202 and 1204 are similar to step 1102 of FIG. 11. In some embodiments, steps 1202 and 1204 include performing all or a subset of the process of FIG. 6. In step 1206 of FIG. 12, the control circuit identifies a slow plane of the multiple planes based on the programming process. Step 1206 is similar to step 1104 of FIG. 11. In step 1208 of FIG. 12, the control circuitry completes the programming process for memory cells of the set of non-volatile memory cells arranged in multiple planes that are targeted to a second set of one or more data states (e.g., data state G of FIG. 5C) including increasing speed of programming for the slow plane relative to another plane of the multiple planes. The second set of one or more data states are higher in threshold voltage than the first set of data states. Step 1208 is similar to steps 1106 and 1108 of FIG. 11. Note that the processes of FIGS. 11 and 12 can be performed on memory cells storing any number of bits of data per memory cell. In some embodiment, step 1208 includes continuing the process of FIG. 6 (i.e. continuing to perform a portion of the process of Figure after step 1204).

In one embodiment of the process of FIG. 12, the second set of one or more data states is a last data state (e.g., data state G of FIG. 5C) with highest threshold voltages of all data states; the completing the programming process for memory cells of the set of non-volatile memory cells arranged in multiple planes that are targeted to the second set of data states comprises only performing programming for the last data state; and the completing the programming process for memory cells of the set of non-volatile memory cells arranged in multiple planes that are targeted to the second set of data states comprises programming memory cells of the slow plane at a speed that has been increased from a respective nominal speed and programming memory cells of a plane other than the slow plane at a speed that has not been increased from a respective nominal speed.

Figure 13:
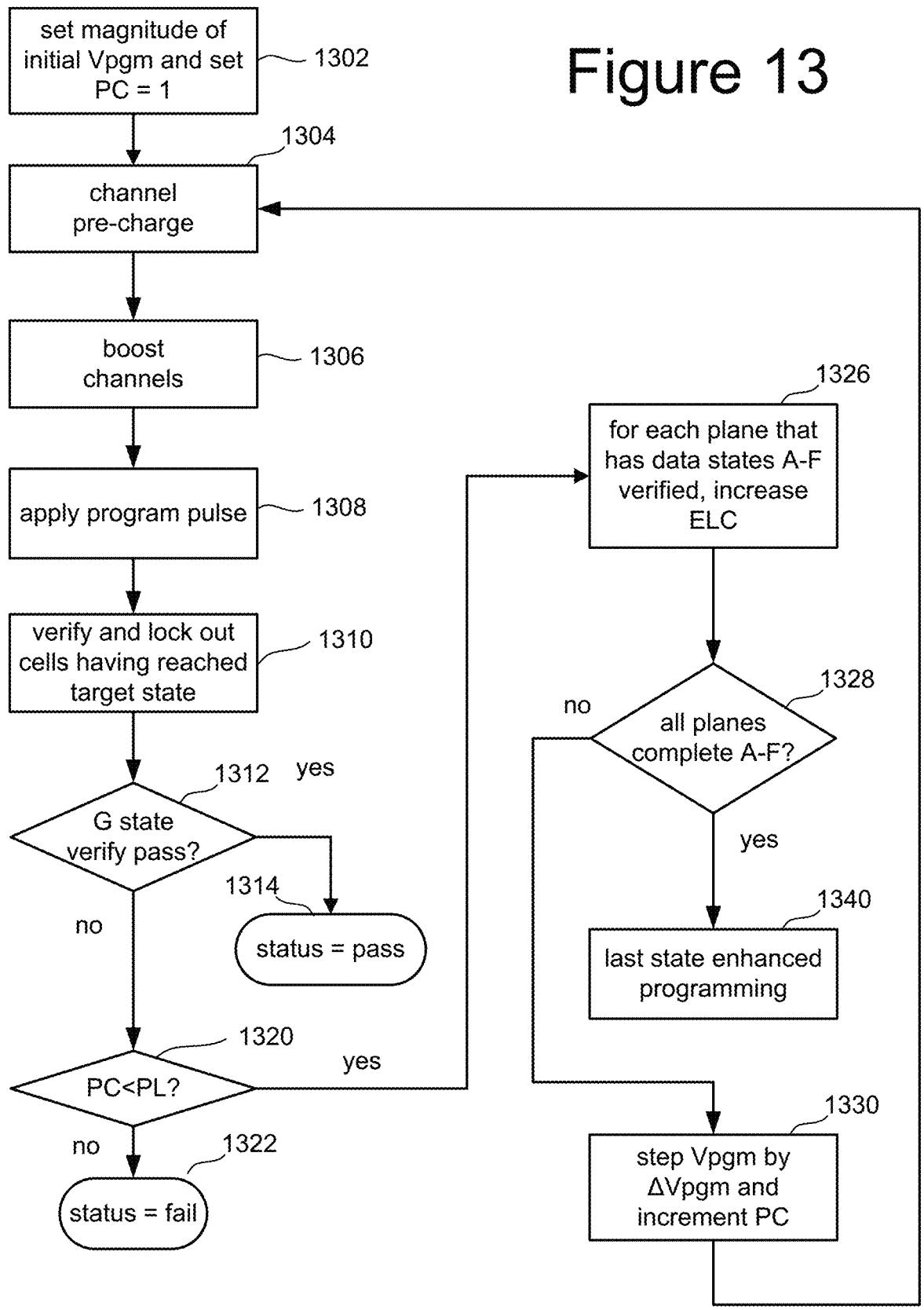
FIG. 13 is a flow chart of one embodiment of a process for programming.
Figure 14:
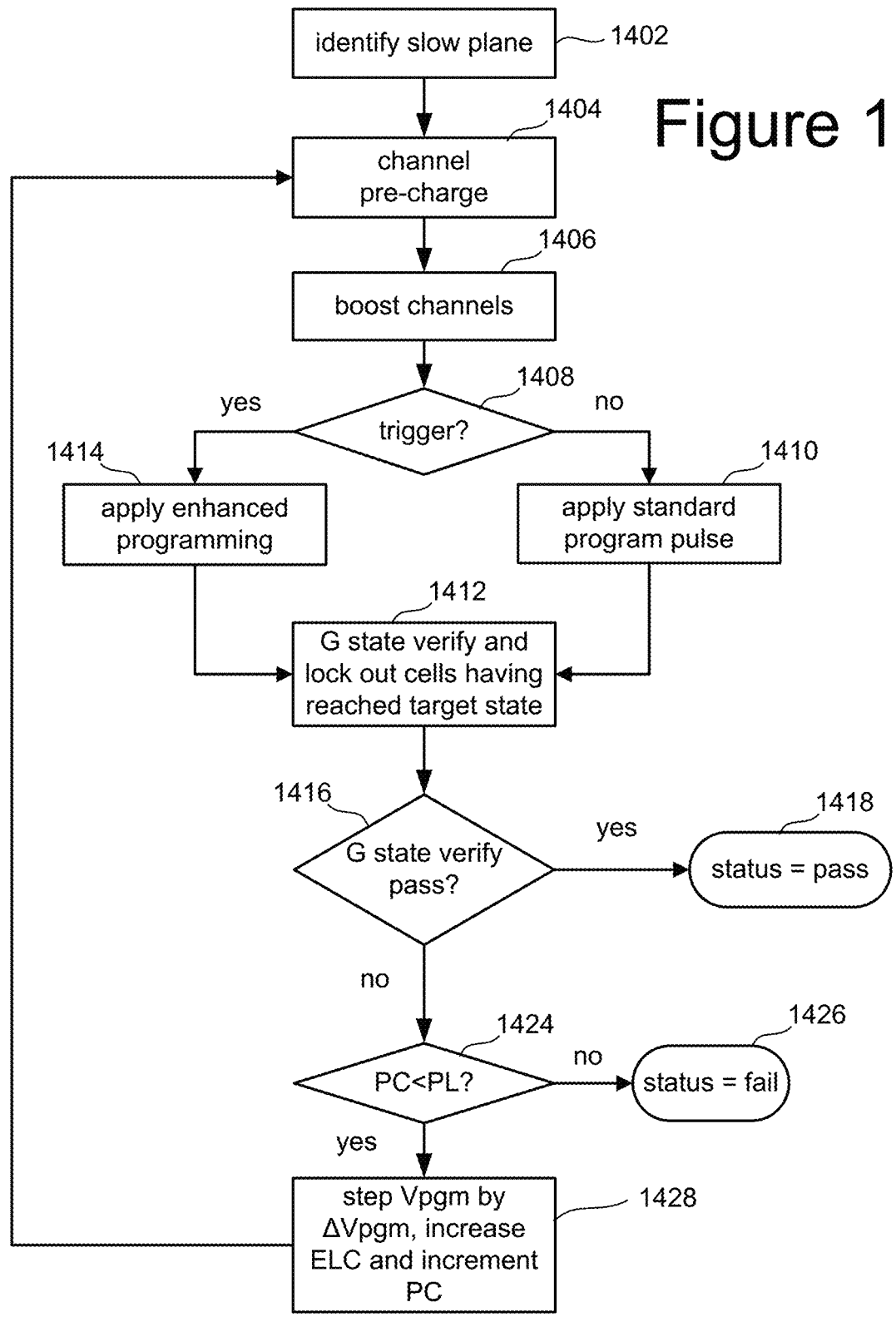
FIG. 14 is a flow chart of one embodiment of a process for programming.

FIGS. 13 and 14 together form a flow chart describing another embodiment of a process to concurrently program data into the multiple planes such that after the slow plane(s) completes programming for all but the last one or more data states an enhanced program operation (e.g., accelerated programming) can be applied for the last one or more data states for the slow plane(s). The process of FIGS. 13 and 14 is an example implementation of the processes of FIG. 11 and/or FIG. 12. In one example embodiment, the process of FIGS. 13 and 14 is performed by any of the embodiments of a control circuit discussed above. In one example embodiment, the process of FIGS. 13 and 14 is performed by integrated memory assembly 207 using any of the embodiments of a control circuit discussed above of control die 211 to program memory cells (e.g., NAND strings of memory structure 202) on memory die 201. In one embodiment, the process of FIGS. 13 and 14 is performed at the direction of state machine 262 (or another processor).

In step 1302 of FIG. 13, the programming voltage signal (Vpgm) is initialized to the starting magnitude (e.g., ~12-16V or another suitable level) and the program counter PC is initialized at 1. In one embodiment, the group of memory cells selected to be programmed (referred to herein as the selected memory cells) are programmed concurrently and all memory cells in a same plane are connected to the same word line (the selected word line). The process of FIGS. 13 and 14 concurrently program data into memory cells in multiple planes. In step 1304, the control die pre-charges channels of NAND strings that include memory cells connected to the selected word line that are to be inhibited from programming. In step 1306, NAND strings that include memory cells connected to the selected word line (of each plane) that are to be inhibited from programming have their channels boosted to inhibit programming. In one embodiment, the unselected word lines receive one or more boosting voltages (e.g., ~7-11 volts), also referred to as pass voltages, to perform boosting schemes. A program inhibit voltage is applied to the bit lines coupled the unselected NAND string. In one embodiment, for example, the channel is pre-charged to ~2 volts in step 1304 and then floated. In step 1306, the channel is boosted up from the 2 volts to a boosting voltage of approximately 8-10 volts. In step 1308, a program voltage pulse of the programming voltage signal Vpgm is applied to the selected word line of each plane. If a memory cell on a NAND string should be programmed, then the corresponding bit line is biased at a program enable voltage. In step 1308, the program pulse is concurrently applied to all memory cells connected to the selected word lines so that all of the memory cells connected to the selected word lines are programmed concurrently (unless they are inhibited from programming). In step 1310, program verify is performed and memory cells that have reached their target states are locked out from further programming by the control circuit. Step 1310 includes performing verification of programming by sensing at one or more verify compare levels. In one embodiment, the verification process is performed by testing whether the threshold voltages of the memory cells selected for programming have reached the appropriate verify compare voltage. In step 1310, a memory cell may be locked out after the memory cell has been verified (by a test of the threshold voltage) that the memory cell has reached its target state. Steps 1302-1310 of FIG. 13 are similar to steps 602-610 of FIG. 6.

In step 1312, it is determined whether all memory cells targeted for programming to state G have successfully verified. If so, then the programming process has successfully completed and a status=pass is reported in step 1314. If the not all memory cells targeted for programming to state G have successfully verified, then the process continues at step 1320. In some embodiments, step 1312 is similar to step 612. In one embodiment, step 1312 is performed separately for each plane.

In one embodiment, step 1312 includes determining all memory cell targeted for programming to state G have threshold voltages greater than Vvg. In another embodiment, step 1312 includes counting the number of memory cells targeted for programming to state G that do not have threshold voltages greater than Vvg and determining if that number is low enough (e.g., less than capacity of ECCC to correct errors). If that number is low enough, then consider the programming process to be successfully completed.

In step 1320, the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 1322. If the program counter PC is less than the program limit value PL, then the process continues at step 1326.

The control circuit will maintain a separate Extra Loop Count (ELC) for each plane. The ELC indicates the number of loops of the programming process performed after completing programming for all data states except the last data state(s). For example, ELC may indicate the number of loops of the programming process performed after completing programming for data states A-F for the embodiment of FIG. 5C (memory cells store 3 bits of data per memory cell). In step 1326, for each plane that has successfully completed programming for data states A-F (successfully verified all memory cells targeted for programming to data states A-F in step 1310), the control circuit increments the ELC for that respective plane. For example, if in the most recent performance of step 1310 Plane 2 had all of its memory cells that are targeted for programming to data states A-F successfully verify, then in step 1326 ELC for Plane 3 is incremented from zero to one and in subsequent loops (subsequent performances of step 1326 for this programming process) ELC for Plane 2 will be incremented again.

In step 1328, the control circuit determines whether all planes have successfully completed programming for data states A-F (successfully verified all memory cells targeted for programming to data states A-F). If not, the process continues at step 1330 during which time the Program Counter PC is incremented by 1 and the programming voltage signal Vpgm is stepped up to the next magnitude. For example, the next program voltage pulse will have a magnitude greater than the previous pulse by a step size ΔVpgm (e.g., a step size of 0.1-1.0 volts). After step 1330, the process loops back to step 1304 and another program voltage pulse is applied to the selected word line so that another loop/iteration (steps 1304-1326 and 1330) of the programming process of FIG. 13 is performed. Steps 1302-1322 and step 1330 of FIG. 13 are similar to steps 602-626 of FIG. 6.

If, in step 1328, it is determined that all planes have successfully completed programming for data states A-F, then the control circuit performs last state enhanced programming in step 1340. FIG. 14 is a flow chart describing one embodiment of a process for performing last state enhanced programming. That is, the process of FIG. 14 is an example implementation of step 1340 of FIG. 13.

In step 1402 of FIG. 14, the control circuit identifies one or more slow planes. As discussed above, the control circuit will maintain a separate ELC for each plane, such that the ELC indicates the number of loops of the programming process performed after completing programming for all data states except the last data state(s) for the respective plane. In one embodiment, step 1402 includes determining which plane has the lowest ELC such that the plane with the lowest ELC is the slow plane. In some instances, more than one plane can be tied for lowest ELC, thus, the multiple planes tied for lowest ELC will all be identified as slow planes and have their programming enhanced/accelerated for the last one or more data states. In some embodiments, the lowest data state will always have an ELC=1 at step 1402.

In step 1404, the control circuit pre-charges channels of NAND strings that include memory cells connected to the selected word line that are to be inhibited from programming. Step 1404 is similar to step 1304. In step 1406, NAND strings that include memory cells connected to the selected word line(s) that are to be inhibited from programming have their channels boosted to inhibit programming. Step 1406 is similar to step 1306.

In step 1408, it is determined whether a trigger has been satisfied. In one example implementation, the enhanced/accelerated programming for the slow plane can be delayed one or more program voltage pulses using the trigger. That is, in one embodiment, the control circuit is configured to increase the speed of programming for the slow plane relative to another plane of the multiple planes during the second portion of the programming after a predefined number of program voltage pulses during the second portion of the programming process. For example, a system configuration parameter, TRIGGER, can be set to be an integer greater than zero and step 1408 includes determining whether ELC for the slow plane (defined as ELC_S) is greater than or equal to TRIGGER (ELC_S≥TRIGGER). If TRIGGER=1, then the first time step 1408 is performed for the programming process ELC_S=TRIGGER=1, so the trigger is satisfied (ELC_S≥TRIGGER) and the process continues at step 1414. If TRIGGER=2, then the first time step 1408 is performed for the programming process ELC_S=1, TRIGGER=2 and ELC_S<TRIGGER, so the trigger is not satisfied and the process continues at step 1410; however, the second time that step 1408 is performed for the programming process ELC_S=2, TRIGGER=2 and ELC_S≥TRIGGER, so the trigger is satisfied and the process continues at step 1414.

If the trigger is not satisfied (i.e., the enhanced/accelerated programming for the slow plane should be delayed), then in step 1410 the program voltage pulse is concurrently applied to all memory cells connected to the selected word lines so that all of the memory cells connected to the selected word lines are programmed concurrently (unless they are inhibited from programming). Step 1410 includes performing standard programming without the enhanced/accelerated programming for the slow plane(s). Step 1410 is similar to step 1308. In step 1412, program verify is performed for data state G (the last data state) and memory cells that have reached their data state G are locked out from further programming by the control circuit.

In step 1416 it is determined whether all memory cells targeted for programming to state G (last data state) have successfully verified. If so, then the programming process has successfully completed and a status=pass is reported in step 1418. If the not all memory cells targeted for programming to state G have successfully verified, then the process continues at step 1424. In one embodiment, step 1416 is performed separately for each plane. In one embodiment, step 1416 includes determining whether all memory cell targeted for programming to state G have threshold voltages greater than Vvg. In another embodiment. Step 1416 includes counting the number of memory cells targeted for programming to state G that do not have threshold voltages greater than Vvg and determining if that number is low enough (e.g., less than capacity of ECCC to correct errors). If that number is low enough, then consider the programming process to be successfully completed.

In step 1424, the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 1426.

If the program counter PC is less than PL, then the process continues at step 1428 during which time the Program Counter PC is incremented by 1, the programming voltage signal Vpgm is stepped up to the next magnitude, and ELC is incremented by 1 for each plane. For example, the next pulse will have a magnitude greater than the previous pulse by a step size ΔVpgm (e.g., a step size of 0.1-1.0 volts). After step 1428, the process loops back to step 1404 and another program voltage pulse is applied to the selected word line so that another loop (steps 1404-1428) of the programming process of FIG. 14 is performed.

If (in step 1408) the trigger is satisfied (e.g., ELC_S≥TRIGGER), then the control circuit performs enhanced (e.g., accelerated) programming for the one or more slow planes in step 1414. In one embodiment, step 1414 includes performing standard programming for planes that are not slow panes. After performing the enhanced programming of step 1414, the process continues at step 1412 to perform program verification as discussed above.

The enhanced programming of step 1414 includes increasing the speed of programming for the one or more slow planes relative to one or more other planes (e.g. fast programming planes). In one embodiment of step 1414, the program voltage pulse is concurrently applied to all memory cells connected to the selected word lines so that all of the memory cells connected to the selected word lines are programmed concurrently (unless they are inhibited from programming) and one or more actions are purposefully taken to increase the speed of programming for the one or more slow planes relative to one or more other planes. In one embodiment, the control circuit is configured to increase the speed of programming for the one or more slow planes relative to other planes by increasing a duration of the program voltage pulse applied to the word line connected to the memory cells of the slow plane(s). In another embodiment, the control circuit is configured to increase the speed of programming for the slow plane(s) relative to other planes by increasing a duration of the program voltage pulse for all planes and raising a bit line voltage connected to memory cells of planes other than the slow plane. In another embodiment, the control circuit is configured to increase the speed of programming for the slow plane(s) relative to other planes by increasing the step size (e.g., ΔVpgm) for memory cells of the slow plane(s). In another embodiment, the control circuit is configured to increase the speed of programming for the slow plane(s) relative to other planes by increasing the step size for all planes and raising a bit line voltage connected to memory cells of planes other than the slow plane(s). In another embodiment, the control circuit is configured to increase the speed of programming for the slow plane(s) relative to other planes by lowering a bit line voltage to a negative voltage for memory cells of the slow plane that are being programmed. That is, in one embodiment, a negative voltage is applied to bit lines connected to NAND strings of the slow plane that contain memory cells being programmed to data state G. In one embodiment of step 1414, while the memory cells of the slow plane experience the enhanced (e.g., accelerated) programming, the memory cells of the other planes (planes not identified to be slow planes) will receive/experience standard programming (no extra action taken to accelerate programming), so the enhanced programming is only experienced by memory cells of the slow plane. In another embodiment of step 1414, while the memory cells of the slow plane experience the enhanced (e.g., accelerated) programming, the memory cells of the other planes (planes not identified to be slow planes) will receive/experience somewhat faster programming but the increase in speed of the programming for the other planes is less than the increase in speed of the programming for the slow planes.

The process of FIGS. 13 and 14 is an example implementation of the processes of FIG. 11 and/or FIG. 12. For example, steps 1302-1330 of FIG. 13 are an example implementation of step 1102 of FIG. 11 and steps 1202-1204 of FIG. 12. Step 1402 of FIG. 14 is an example implementation of step 1104 of FIG. 11 and step 1206 of FIG. 12. Steps 1404-1428 of FIG. 14 are an example implementation of step 1106 of FIG. 11 and step 1208 of FIG. 12. Step 1414 of FIG. 14 implements step 1108 of FIG. 11 and a portion of step 1208 of FIG. 12. In one embodiment, steps 1302-1330 of FIG. 13 are an example implementation of the first portion of the programming process and steps 1404-1428 of FIG. 14 are an example implementation the second portion of the programming process.

Figure 15:
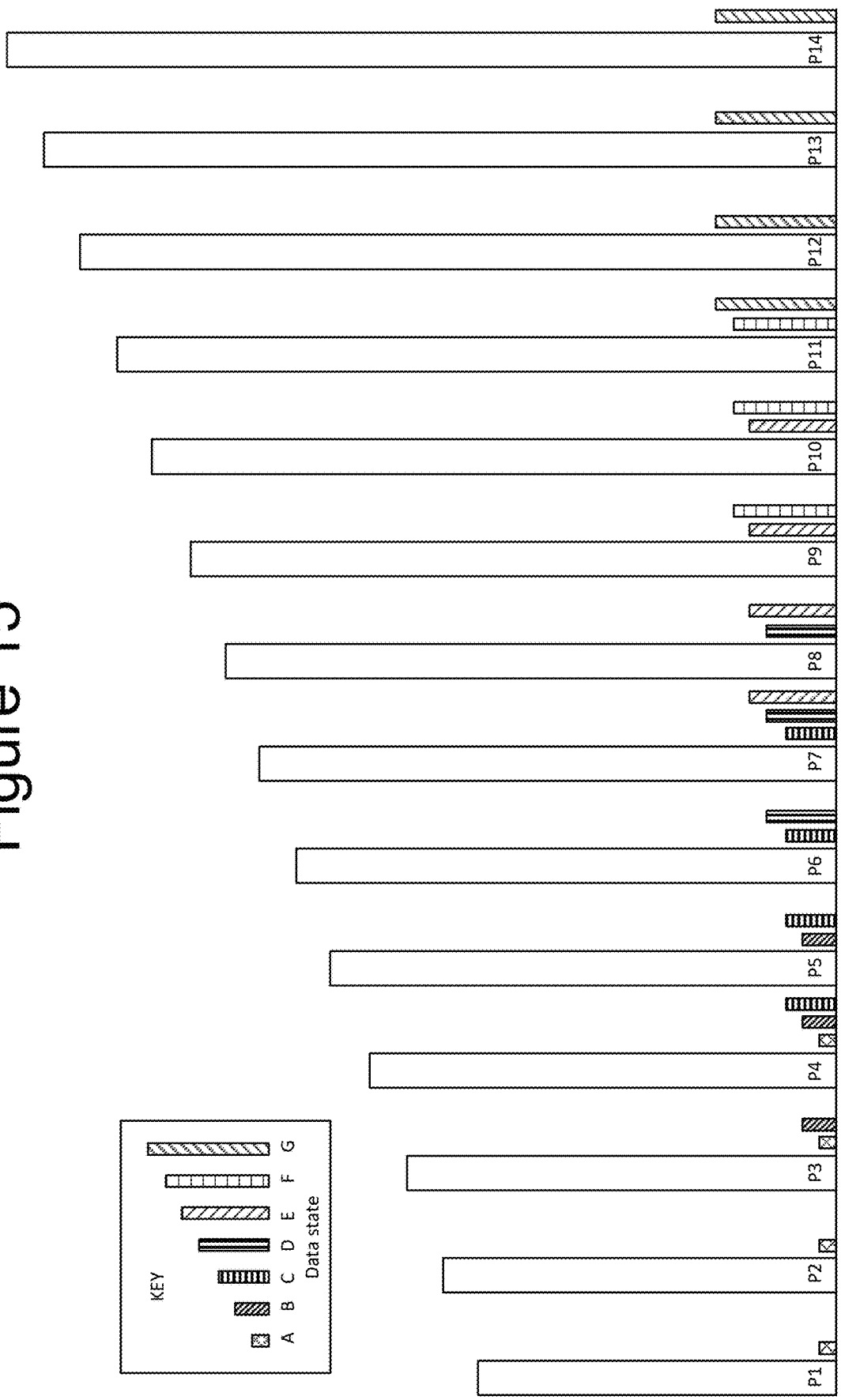
FIG. 15 depicts a voltage waveform applied to a selected word line during programming.
Figure 16:
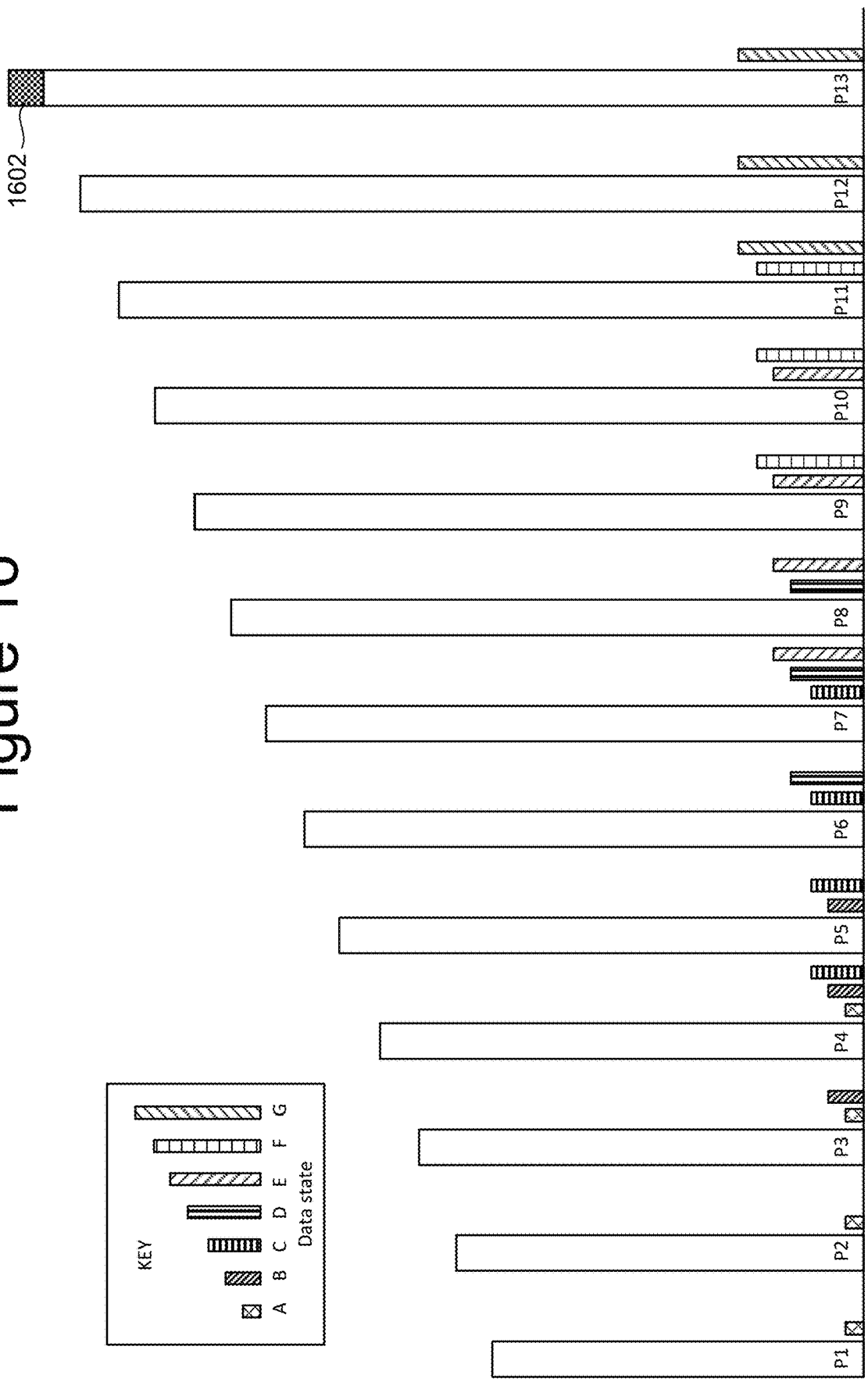
FIG. 16 depicts a voltage waveform applied to a selected word line during programming.

FIG. 15 depicts an example voltage waveform applied to a selected word line during programming using the standard programming process of FIG. 6. FIG. 16 depicts an example voltage waveform applied to a selected word line during programming using the process of FIGS. 13 and 14 to concurrently program data into the multiple planes such that after the slow plane(s) completes programming for all but the last one or more data states an enhanced program operation (e.g., accelerated programming) can be applied for the last one or more data states for the slow plane(s). FIG. 16 provides an example of the use of the process of FIGS. 13 and 14, and demonstrates how the use of the process of FIGS. 13 and 14 reduces the time needed for programming a set of data into the multiple planes.

FIG. 15 shows fourteen program voltage pulses P1-P14 (see e.g., step 608 of FIG. 6). Between the program voltage pulses P1-P14, and after P14, are verify voltage pulses for data states A-G (see FIG. 5C). Using an intelligent verify algorithm, the control circuit only applies a subset of verify voltage pulses (for a subset of the data states A-G) after each program voltage pulse based on expected data states that need to be verified (see e.g., step 610 of FIG. 6). One embodiment of an intelligent verify algorithm uses the verify level of state N−1 as a detection level to judge whether the natural Vt is already approaching the verify level of state N, and if the memory cells passing state N−1 verify are larger than a bit ignore number then the verify of state N will start in the next verify sequence. For example, between P1 & P2 and between P2 and P3 the control circuit only applies a verify pulse to verify for data state A, between P3 and P4 the control circuit only applies a verify pulses to verify for data states A & B, between P4 and P5 the control circuit only applies verify pulses to verify for data states A & B &C, between P5 and P6 the control circuit only applies verify pulses to verify for data states B & C, between P6 and P7 the control circuit only applies verify pulses to verify for data states C & D, between P7 and P8 the control circuit only applies verify pulses to verify for data states C & D & E, between P8 and P9 the control circuit only applies verify pulses to verify for data states D & E, between P9 and P10 the control circuit only applies verify pulses to verify for data states E & F, between P10 and P11 the control circuit only applies verify pulses to verify for data states E & F, between P11 and P12 the control circuit only applies verify pulses to verify for data states F & G, between P12 and P13 the control circuit only applies a verify pulse to verify for data state G, between P13 and P14 the control circuit only applies a verify pulse to verify for data state G, and after P14 the control circuit only applies a verify pulse to verify for data state G.

In the example of FIGS. 15 and 16, Plane 0-Plane 6 are fast planes and Plane 7 is a slow plane (see FIGS. 7 and 9); and Plane 0-Plane 6 complete programming to data states A-F after program voltage pulse P10. That is, when performing program verify (see e.g. step 610) after program voltage pulse P10, all of the memory cells of Plane 0-Plane 6 that are targeted to be programmed to data states E and F successfully verify (e.g., threshold voltages reached VvE and VvF, respectively), and all of the memory cells of Plane 0-Plane 6 that are targeted to be programmed to data states A-D successfully verified prior to program voltage pulse P10. When verifying memory cells of Planes 0-Plane 6 for data state G after program voltage pulse P13, the control circuit determines that all memory cells of Plane 0-Plane 6 that are targeted to be programmed to data state G have been successfully programmed and verified; therefore, all memory cells selected for programming in Plane 0-Plane 6 have completed programming at program voltage pulse P13.

Plane 7 is a slow plane. Plane 7 completes programming of data states A-F after program voltage pulse P11 and completes programming of data state G after program voltage pulse P14. Therefore, all memory cells selected for programming in Plane 7 have completed programming at program voltage pulse P14. Since a set of data is being concurrently programmed in and across Plane 0-Plane 7, the time for programming comprises fourteen program voltage pulses (e.g., fourteen loops of the process of FIG. 6), as the time for programming is determined based on the slowest plane.

FIG. 16 shows thirteen program voltage pulses P1-P14. Between the program voltage pulses P1-P13, and after P3, are verify voltage pulses for data states A-G (see FIG. 5C). Using the intelligent verify algorithm, the control circuit only applies a subset of verify voltage pulses (for a subset of the data states A-G) after each program voltage pulse based on expected data states that need to be verified, just as described above with respect to FIG. 15. For example, between P1 & P2 and between P2 and P3 the control circuit only applies a verify pulse to verify for data state A, between P3 and P4 the control circuit only applies verify pulses to verify for data states A & B, between P4 and P5 the control circuit only applies verify pulses to verify for data states A & B & C, between P5 and P6 the control circuit only applies verify pulses to verify for data states B & C, between P6 and P7 the control circuit only applies verify pulses to verify for data states C & D, between P7 and P8 the control circuit only applies verify pulses to verify for data states C & D & E, between P8 and P9 the control circuit only applies verify pulses to verify for data states D & E, between P9 and P10 the control circuit only applies verify pulses to verify for data states E & F, between P10 and P11 the control circuit only applies verify pulses to verify for data states E & F, between P11 and P12 the control circuit only applies verify pulses to verify for data states F & G, between P12 and P13 the control circuit only applies a verify pulse to verify for data state G, and after P13 the control circuit only applies a verify pulse to verify for data state G.

As described above with respect to FIG. 15, Plane 0-Plane 6 complete programming of data states A-F after program voltage pulse P10. That is, the loop of steps 1304-1330 (see FIG. 13) is performed ten times, once each for P1-P10. After program voltage pulse P10, ELC is set to 1 for Plane 0-Plane 6. As described above with respect to FIG. 15, Plane 7 completes programming of data states A-F after program voltage pulse P11. After program voltage pulse P11, ELC is set to 2 for Plane 0-Plane 6 and ELC is set to 1 for Plane 7 (as each plane has a separate value for ELC). After program voltage pulse P11, step 1402 is performed and the control circuit determines that Plane 7 is the slow plane because it has the lowest ELC. In this example, TRIGGER=2 so the first time step 1408 is performed for the programming process ELC_S=1 for Plane 7 and ELC_S<TRIGGER so the trigger is not satisfied (step 1408) and the process continues at step 1410 with no enhanced/accelerated programming occurring for program voltage pulse P12. That is, in one embodiment, all memory cells targeted to be programmed to data state G for Plane 0-Plane 7 will receive the same programming signals.

After program voltage pulse P12, ELC is set to 3 for Plane 0-Plane 6 and ELC is set to 2 for Plane 7 (ELC_S=2). After program voltage pulse P12, the trigger is satisfied (step 1408) because ELC_S=2 (for slow plane Plane 7) and ELC_S≥TRIGGER, so the trigger is satisfied and the process continues at step 1414 during which memory cells of Plane 7 targeted for data state G receive enhanced/accelerated programming for program voltage pulse P13 while memory cells of Plane 0-Plane 6 targeted for data state G receive do not enhanced/accelerated programming. In the example of FIG. 16, the enhanced/accelerated programming comprises increasing the speed of programming for Plane 7 relative to Plane 0-Plane 6 by increasing the step size of the program voltage pulses for all planes (see portion 1602 of P13) and raising a bit line voltage connected to memory cells of Plane 0-Plane 7. Increasing the step size of the program voltage pulse for Plane 7 (see portion 1602 of P13) increases the speed of programming for memory cells of Plane 7 targeted for data state G. Raising the bit line voltage connected to memory cells of Plane 0-Plane 6 counteracts the increasing of the step size of the program voltage pulse for Plane 0-Plane 6 so the speed of programming is not enhanced for Plane 0-Plane 6.

One embodiment further includes a MAX_PLANE parameter that indicates the maximum number of slow planes that can be enhanced. If, in steps 1104/1206/1402, the control circuit determines that the number of slow planes is less than or equal to the MAX_PLANE parameter, then the enhanced/accelerated programming for the last data state for slow planes is performed as described above. If, in steps 1104/1206/1402, the control circuit determines that the number of slow planes is greater than the MAX_PLANE parameter, then the enhanced/accelerated programming for the last data state for slow planes is not performed and slow planes are programmed in the traditional manner (e.g., the same as fast planes).

A faster programming process has been disclosed for programming a multi-plane memory.

One embodiment includes a non-volatile storage apparatus, comprising a plurality of non-volatile memory cells arranged in multiple planes and a control circuit connected to the multiple planes. The control circuit is configured to perform a programming process to concurrently program data into the multiple planes including performing a first portion of the programming process concurrently for the multiple planes and performing a second portion of the programming process. The control circuit is configured to identify a slow plane of the multiple planes based on the first portion of the programming process and increase the speed of programming for the slow plane relative to another plane of the multiple planes during the second portion of the programming process.

One embodiment includes a method comprising: starting a programming process that concurrently programs a set of data into a set of non-volatile memory cells arranged in multiple planes; completing the programming process for memory cells of the set of non-volatile memory cells arranged in multiple planes that are targeted to a first set of data states; identifying a slow plane of the multiple planes based on the programming process; and completing the programming process for memory cells of the set of non-volatile memory cells arranged in multiple planes that are targeted to a second set of data states including increasing speed of programming for the slow plane relative to another plane of the multiple planes, the second set of one or more data states are higher in threshold voltage than the first set of data states.

One embodiment includes a non-volatile storage apparatus, comprising a plurality of planes of non-volatile memory cell. The non-volatile memory cells are arranged in vertical NAND strings. Each plane comprises bit lines and word lines connected to non-volatile memory cells. The non-volatile memory cells are arranged in blocks. Each plane comprises multiple blocks connected to a same set of bit lines. Each block comprises multiple NAND strings connected to a same set of word lines. The non-volatile storage apparatus further comprises means, connected to the plurality of planes, for performing a programming process (e.g., FIGS. 11-14) that concurrently programs a set of data into non-volatile memory cells arranged in multiple planes of the plurality of planes by: concurrently performing a first portion of the programming process for the non-volatile memory cells arranged in multiple planes (e.g., steps 1102, 1104, 1202, 1302-1330); completing the first portion of the programming process by non-volatile memory cells in multiple planes that are targeted to a first set of data states successfully completing programming for the set of data (e.g., steps 1102, 1104, 1204, 1302-1330); identifying a slow plane of the multiple planes based on the first portion of the programming process (e.g., steps 1104, 1206, 1402); increasing speed of programming for the slow plane relative to another plane of the multiple planes (e.g., steps 1108, 1208, 1414); and performing a second portion of the programming process that only programs non-volatile memory cells in multiple planes that are targeted to a last data state, the last data state is higher in threshold voltage than the first set of data states (e.g., steps 1106, 1208,1340, 1402-1428).

Examples of the means for performing a programming process that concurrently programs a set of data into non-volatile memory cells arranged in multiple planes of the plurality of planes includes any one of or any combination of memory controller 120, state machine 262, all or a portion of system control logic 260, all or a portion of row control circuitry 220, all or a portion of column control circuitry 210, control circuit 1002, a microcontroller, a microprocessor, and/or other similar functioned circuits. The means for performing a programming process that concurrently programs a set of data into non-volatile memory cells arranged in multiple planes of the plurality of planes can include hardware only or a combination of hardware and software (including firmware). For example, a controller programmed by firmware to perform the functions described herein is one example. The means for performing a programming process that concurrently programs a set of data into non-volatile memory cells arranged in multiple planes of the plurality of planes can include a processor, FGA, ASIC, integrated circuit, or other type of circuit. The means for performing a programming process that concurrently programs a set of data into non-volatile memory cells arranged in multiple planes of the plurality of planes performs any one or more of the process of FIG. 11, the process of FIG. 12 and/or the process of FIGS. 13 and 14.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a plurality of non-volatile memory cells arranged in multiple planes; and
a control circuit connected to the multiple planes, the control circuit is configured to perform a programming process to concurrently program data into the multiple planes including performing a first portion of the programming process concurrently for the multiple planes and performing a second portion of the programming process concurrently for the multiple planes, the second portion of the programming process is performed after the first portion of the programming process such that the second portion of the programming process completes programming for the programming process, the control circuit is configured to identify a slow plane of the multiple planes based on the first portion of the programming process and increase the speed of programming for the slow plane relative to another plane of the multiple planes that is concurrently experiencing programming during the second portion of the programming process, the slow plane includes non-volatile memory cells that program slower than non-volatile memory cells of another plane.

2. The non-volatile storage apparatus of claim 1, wherein:
the first portion of the programming process comprises the control circuit completing the programming process for a first subset of memory cells of the plurality of non-volatile memory cells arranged in multiple planes that are targeted to a first set of data states; and
the second portion of the programming process comprises the control circuit completing the programming process for a second subset of memory cells of the plurality of non-volatile memory cells arranged in multiple planes that are targeted to a second set of one or more data states, the second set of one or more data states are higher in threshold voltage than the first set of data states.

3. The non-volatile storage apparatus of claim 2, wherein:
the first portion of the programming process further comprises the control circuit starting the programming process for the second subset of memory cells.

4. The non-volatile storage apparatus of claim 2, wherein:
the control circuit is configured to perform the programming process by performing multiple program loops, each program loop comprises the control circuit applying a program voltage pulse to the plurality of non-volatile memory cells and performing program verification for at least a subset of the plurality of non-volatile memory cells; and the control circuit is configured to identify a slow plane of the multiple planes based on the first portion of the programming process by:
- counting a number of program loops performed for each plane after all memory cells of the respective plane that are targeted to the first set of data states have completed the programming process and before all planes have completed the first portion of the programming process, and
- identifying the slow plane as a plane with a smallest number of program loops performed after all memory cells of the respective plane that are targeted to the first set of data states have completed the programming process and before all planes have completed the first portion of the programming process.

5. The non-volatile storage apparatus of claim 1, wherein:
the first portion of the programming process comprises the control circuit completing the programming process for a first subset of memory cells of the plurality of non-volatile memory cells arranged in multiple planes that are targeted to a first set of data states; and
the second portion of the programming process comprises the control circuit completing the programming process for a second subset of memory cells of the plurality of non-volatile memory cells arranged in multiple planes that are targeted to a last data state, the last data state is higher in threshold voltage than the first set of data states.

6. The non-volatile storage apparatus of claim 1, wherein:
the first portion of the programming process comprises the control circuit completing the programming process for a first subset of memory cells of the plurality of non-volatile memory cells arranged in multiple planes that are targeted to a first set of data states; and
the second portion of the programming process comprises the control circuit only performing the programming process for memory cells of the plurality of non-volatile memory cells arranged in multiple planes that are targeted to a last data state, the last data state is higher in threshold voltage than the first set of data states.

7. The non-volatile storage apparatus of claim 1, wherein:
the control circuit is configured to perform the programming process by performing multiple program loops, each program loop comprises the control circuit applying a program voltage pulse to the plurality of non-volatile memory cells; and
the control circuit is configured to increase the speed of programming for the slow plane relative to another plane of the multiple planes during the second portion of the programming process by increasing a duration of the program voltage pulse for the slow plane during the second portion of the programming process.

8. The non-volatile storage apparatus of claim 1, wherein:
each plane comprises bit lines and word lines connected to non-volatile memory cells;
the control circuit is configured to perform the programming process by applying a series of program voltage pulses to the plurality of non-volatile memory cells; and
the control circuit is configured to increase the speed of programming for the slow plane relative to another plane of the multiple planes during the second portion of the programming process by increasing a duration of the program voltage pulse for all planes and raising a bit line voltage connected to memory cells of planes other than the slow plane during the second portion of the programming process.

9. The non-volatile storage apparatus of claim 1, wherein:
the control circuit is configured to perform the programming process by applying a series of program voltage pulses to the plurality of non-volatile memory cells, the series of program voltage pulses increase in voltage magnitude by a step size from pulse to pulse; and
the control circuit is configured to increase the speed of programming for the slow plane relative to another plane of the multiple planes during the second portion of the programming process by increasing the step size for memory cells of the slow plane that are being programmed during the second portion of the programming process.

10. The non-volatile storage apparatus of claim 1, wherein:
each plane comprises bit lines and word lines connected to non-volatile memory cells;
the control circuit is configured to perform the programming process by applying a series of program voltage pulses to the plurality of non-volatile memory cells, the series of program voltage pulses increase in voltage magnitude by a step size from pulse to pulse; and
the control circuit is configured to increase the speed of programming for the slow plane relative to another plane of the multiple planes during the second portion of the programming process by increasing the step size for all planes and raising a bit line voltage connected to memory cells of planes other than the slow plane during the second portion of the programming process.

11. The non-volatile storage apparatus of claim 1, wherein:
each plane comprises bit lines and word lines connected to non-volatile memory cells;
the control circuit is configured to perform the programming process by applying a series of program voltage pulses to the plurality of non-volatile memory cells, the series of program voltage pulses increase in voltage magnitude by a step size from pulse to pulse; and
the control circuit is configured to increase the speed of programming for the slow plane relative to another plane of the multiple planes during the second portion of the programming process by lowering a bit line voltage to a negative voltage for memory cells of the slow plane that are being programmed during the second portion of the programming process.

12. The non-volatile storage apparatus of claim 1, wherein:
the control circuit is configured to program memory cells of the slow plane at a speed that has been increased from a respective nominal speed and program memory cells of a plane other than the slow plane at a speed that has not been increased from a respective nominal speed during the second portion of the programming process.

13. The non-volatile storage apparatus of claim 1, wherein:
the control circuit is configured to perform the programming process by applying a series of program voltage pulses to the plurality of non-volatile memory cells; and
the control circuit is configured to increase the speed of programming for the slow plane relative to another plane of the multiple planes during the second portion of the programming after a predefined number of program voltage pulses during the second portion of the programming process.

14. A method, comprising:
starting a programming process that concurrently programs a set of data into a set of non-volatile memory cells arranged in multiple planes, the programming process includes applying program voltage pulses to the set of non-volatile memory cells arranged in multiple planes;
completing the programming process for memory cells of the set of non-volatile memory cells arranged in multiple planes that are targeted to a first set of data states;
identifying a slow plane of the multiple planes based on the programming process, the slow plane includes non-volatile memory cells that experience smallest change in threshold voltage per program voltage pulse as compared to non-volatile memory cells of other planes of the multiple planes; and
completing the programming process for memory cells of the set of non-volatile memory cells arranged in multiple planes that are targeted to a second set of data states including increasing speed of programming for the slow plane relative to another plane of the multiple planes that is concurrently experiencing programming, the second set of one or more data states are higher in threshold voltage than the first set of data states.

15. The method of claim 14, wherein:
the second set of one or more data states is a last data state with highest threshold voltages of all data states;
the completing the programming process for memory cells of the set of non-volatile memory cells arranged in multiple planes that are targeted to the second set of data states comprises only performing programming for the last data state; and
the completing the programming process for memory cells of the set of non-volatile memory cells arranged in multiple planes that are targeted to the second set of data states comprises programming memory cells of the slow plane at a speed that has been increased from a respective nominal speed and programming memory cells of a plane other than the slow plane at a speed that has not been increased from a respective nominal speed.

16. The method of claim 14, wherein:
each plane comprises bit lines and word lines connected to non-volatile memory cells;
the program voltage pulses increase in voltage magnitude by a step size from pulse to pulse; and
the increasing the speed of programming for the slow plane relative to another plane of the multiple planes comprises increasing the step size for all planes and raising a bit line voltage connected to memory cells of planes other than the slow plane.

17. The method of claim 14, wherein:
each plane comprises bit lines and word lines connected to non-volatile memory cells;
the programming process comprises applying a series of program voltage pulses to the plurality of non-volatile memory cells, the series of program voltage pulses increase in voltage magnitude by a step size from pulse to pulse; and
the increasing the speed of programming for the slow plane relative to another plane of the multiple planes comprises increasing the step size for only the slow plane.

18. The method of claim 14, wherein:
each plane comprises bit lines and word lines connected to non-volatile memory cells; and
the increasing the speed of programming for the slow plane relative to another plane of the multiple planes comprises increasing a duration of a program voltage pulse for all planes and raising a bit line voltage connected to memory cells of planes other than the slow plane.

19. The method of claim 14, wherein:
each plane comprises bit lines and word lines connected to non-volatile memory cells; and
the increasing the speed of programming for the slow plane relative to another plane of the multiple planes comprises lowering a bit line voltage to a negative voltage for memory cells of the slow plane.

20. A non-volatile storage apparatus, comprising:
a plurality of planes of non-volatile memory cells, the non-volatile memory cells are arranged in vertical NAND strings, each plane comprises bit lines and word lines connected to non-volatile memory cells, the non-volatile memory cells are arranged in blocks, each plane comprises multiple blocks connected to a same set of bit lines, each block comprises multiple NAND strings connected to a same set of word lines; and
means, connected to the plurality of planes, for performing a programming process that concurrently programs a set of data into non-volatile memory cells arranged in multiple planes of the plurality of planes by:
concurrently performing a first portion of the programming process for the non-volatile memory cells arranged in multiple planes, the programming process includes applying program voltage pulses to the non-volatile memory cells;
completing the first portion of the programming process by non-volatile memory cells in multiple planes that are targeted to a first set of data states successfully completing programming for the set of data;
identifying a slow plane of the multiple planes based on the first portion of the programming process, the slow plane includes non-volatile memory cells that experience smallest change in threshold voltage per program voltage pulse as compared to non-volatile memory cells of other planes of the plurality of planes;
increasing speed of programming for the slow plane relative to another plane of the multiple planes that is concurrently experiencing programming; and
concurrently performing a second portion of the programming process that only programs non-volatile memory cells in multiple planes that are targeted to a last data state, the last data state is higher in threshold voltage than the first set of data states.

* * * * *